United States Patent [19]
Tomikawa

[11] Patent Number: 5,675,296
[45] Date of Patent: Oct. 7, 1997

[54] CAPACITIVE-COMPONENT REDUCING CIRCUIT IN ELECTROSTATIC-TYPE TRANSDUCER MEANS

[76] Inventor: Yoshiro Tomikawa, 1-7 Yukigaya, Otsuka-cho, Ota-ku, Tokyo, Japan

[21] Appl. No.: 587,196

[22] Filed: Jan. 11, 1996

[30] Foreign Application Priority Data

| Jan. 11, 1995 | [JP] | Japan | 7-018655 |
| Mar. 9, 1995 | [JP] | Japan | 7-079570 |
| Jun. 5, 1995 | [JP] | Japan | 7-138289 |

[51] Int. Cl.$^6$ .................. H03B 5/36; H03L 7/06
[52] U.S. Cl. .............. 331/158; 331/18; 331/65; 331/116 R; 310/318
[58] Field of Search ............ 331/18, 25, 65, 331/110, 116 R, 116 FE, 139, 141, 158, 159, 160, 162, 164, 177 R, 177 V; 310/316, 317, 318

[56] References Cited

U.S. PATENT DOCUMENTS

| 3,731,230 | 5/1973 | Cerny, Jr. | 331/116 R |
| 4,227,158 | 10/1980 | Schroeder et al. | 331/2 |
| 4,734,659 | 3/1988 | Tanaka et al. | 331/158 X |
| 4,782,309 | 11/1988 | Benjaminson | 331/139 |
| 5,047,734 | 9/1991 | Newell et al. | 331/46 |
| 5,113,153 | 5/1992 | Soyuer | 331/158 X |
| 5,136,263 | 8/1992 | Lane | 331/158 |

*Primary Examiner*—David Mis
*Attorney, Agent, or Firm*—Guy W. Shoup; Patrick T. Bever

[57] ABSTRACT

A drive voltage is supplied to a piezoelectric oscillator from an A.C. drive power source. Attached to an electrode of the piezoelectric oscillator is a loop circuit in which an amplifier having a (N+1) voltage amplification factor and an electrostatic capacitor are connected in series. When the electrostatic capacity is set to 1/N of a damping capacity of the piezoelectric oscillator, the current flowing through the damping capacity is replaced and shared by current from the electrostatic capacity, thus the drive current will not be consumed by the damping capacity. Therefore, a condition where the damping capacity is minimized depends on a capacity value of the electrostatic capacity and amplification factor of the amplifier only and does not depend on the frequency.

25 Claims, 19 Drawing Sheets

CAPACITIVE-COMPONENT REDUCING CIRCUIT IN ELECTROSTATIC-TYPE TRANSDUCER MEANS

BACKGROUND OF THE INVENTION

1. Field of the Invention

The present invention relates to a circuit for reducing a capacitive component of an electrostatic-type transducer means in which the damping capacity of the piezoelectric oscillator and the capacitive component of an electrostatic transducer are reduced or canceled out so as to enable the realization of an efficient drive and highly sensitive oscillation detection in the electrostatic-type transducer means, such as an electrostatic transducer having the piezoelectric oscillator utilizing the piezoelectric distortion and having electrodes disposed counter to each other with a space therebetween, and it further relates to a drive apparatus for the electrostatic-type transducer means and a detection means therefor.

2. Description of the Related Art

The electrostatic-type transducer means is utilized in various technical fields. For example, an electrostatic oscillator, which is among the electrostatic-type transducer means, is utilized for an apparatus which extracts power electrically as in a piezoelectric transformer, an apparatus which extracts power dynamically as in a piezoelectric motor or piezoelectric actuator, an apparatus which principally extracts a signal as in a piezoelectric gyro, acceleration sensor, ultrasonic sensor, infrared sensor or the like, an apparatus which extracts a signal as in an oscillation device serving as a frequency source, an apparatus which extracts a signal as in a filter, and so on. Similarly, an electrostatic transducer can be utilized for an oscillation-type gyro, acceleration sensor, ultrasonic sensor, infrared sensor or the like.

FIG. 26A through FIG. 28 shows a conventional example of a piezoelectric oscillator serving as the electrostatic-type transducer means. FIG. 26A shows a piezoelectric oscillator 1, while an equivalent circuit shown in FIG. 26B illustrates a piezoelectric oscillator 2 at the time it is oscillating in the vicinity of a resonance point.

In these figures, a series resonance side 3, composed of resistance Rm, capacitance Cm and inductance Lm, indicates equivalently the resonance of the piezoelectric oscillator 2. Capacitance Cd in a parallel resonance side 4, which includes the series resonance side 3, indicates a damping capacity component of the piezoelectric oscillator. FIG. 27 shows a frequency characteristic of admittance in the piezoelectric oscillator 2. In FIG. 27, fa indicates the resonance point (resonance frequency, series resonance point) and fb indicates an anti-resonance point (anti-resonance frequency, parallel resonance point).

When the piezoelectric oscillator is being driven, the current flowing through the damping capacity Cd is a reactive current which contributes no power to the oscillation of the piezoelectric oscillator, thus increasing the power losses of the apparatus. Therefore, since the current is being supplied to this damping capacity Cd, the drive power source also supplies the power to the damping capacity Cd in addition to the power really necessary to oscillate the piezoelectric oscillator.

FIG. 28 is an example of a conventional circuit which equivalently cancels out the current flowing through the damping capacity Cd in the event the piezoelectric oscillator is oscillated at the resonance point fa.

In this conventional example shown in FIG. 28, a coil 6 having an inductance Ld is parallel-connected to the piezoelectric oscillator 2. Here, an impedance Zm of the series resonance side 3 is expressed by equation 1.

(Equation 1)

$$Zm = Rm + j\omega Lm + 1/j\omega Cm$$

An A.C. drive power source 5 in FIG. 28 is a constant-voltage power supply, and a current i flowing to the piezoelectric oscillator 2 and coil 6 is indicated by equation 2 if a voltage applied to the piezoelectric oscillator 2 and coil 6 is denoted as V.

$$i = (1/Zm + j\omega Cd + 1/j\omega Ld) \cdot V \quad \text{(Equation 2)}$$
$$= \{1/Zm + j(\omega Cd - 1/\omega Ld)\} \cdot V$$

From equation 2, a condition for which the current i becomes the minimum is one that satisfies equation 3, and then the current i is indicated by equation 4.

(Equation 3)

$$\omega Cd = 1/\omega Ld$$

(Equation 4)

$$I = (1/Zm) \cdot V$$

Thus, the coil having the inductance Ld indicated With equation 5, where equation 3 is expanded about the inductance Ld is parallel-connected to the piezoelectric oscillator, so that the damping capacity Cd of the piezoelectric oscillator can be equivalently canceled out.

(Equation 5)

$$Ld = 1/\omega^2 Cd = 1/(2\pi f)^2 Cd$$

Canceling out equivalently the current flowing through the damping capacity Cd enables reducing the power source capacity of the A.C. drive power source 5 by that amount thus canceled out.

In order that the piezoelectric oscillator is driven at the state of being resonated, the drive frequency of the A.C. drive power source need lie in the vicinity of the resonance point fa or anti-resonance point fb. However, in a ceramic oscillator and so on of a PZT system, an elastic factor, etc. of the piezoelectric oscillator is changed and its resonance frequency fluctuates due to the temperature change of external environment and the heat generated by the oscillator itself. Moreover, it has been also known that the drive voltage makes the resonance frequency fluctuate. Thus, in order to drive the piezoelectric oscillator constantly in the vicinity of the resonance point fa, the resonance frequency of the piezoelectric oscillator need be detected and be driven at the desired frequency range. Therefore, there can be considered a resonance-point tracking-type drive apparatus which is driven constantly at a frequency close to the resonance frequency and into which a sensor detecting the oscillation state of the piezoelectric oscillator in a latest piezoelectric motor, etc. is built so that the fluctuation in the resonance point of the piezoelectric oscillator can be tracked based on a phase difference between the drive current or drive voltage and a voltage detected by the sensor.

On the other hand, in the case where the piezoelectric oscillator is utilized as a sensor as in an oscillation-type gyroscope, etc. there is caused a problem where the oscillation of the piezoelectric oscillator cannot be detected in a highly sensitive manner because a detection voltage or current obtained from the piezoelectric oscillator is reduced due to the effect of the damping capacity Cd. As for this problem, in the conventional practice the inductance Ld is parallel-connected to the piezoelectric oscillator so as to equivalently cancel out or reduce the damping capacity Cd and so as to improve detectivity thereby, in a similar manner to the case of driving the piezoelectric oscillator.

Moreover, the inductance Ld is connected to an input terminal in order to broaden a comparison bandwidth of the filter because the comparison bandwidth of the filter is constrained by an electro-mechanical coupling factor intrinsic to the piezoelectric oscillator.

However, the inductance Ld canceling equivalently the damping capacity Cd is inversely proportional to (drive frequency f)$^2$ X (damping capacity Cd) as shown in equation 5. Particularly, because the Ld is inversely proportional to the square of the drive frequency f, when the resonance frequency is changed due to temperature change, etc., the quantity to equivalently cancel out the damping capacity Cd will decrease exponentially the difference between the drive frequency and resonance frequency becomes greater. Moreover, the inductance Ld is generally of a greater size than other circuit parts such as a resistor R and capacitor C, thus it is difficult to make the circuit compact-sized. Moreover, in order to improve the equivalently canceling out effect, the inductance need to be varied and adjusted according to the piezoelectric oscillator. However, the inductance is not suitable for a varying operation compared to the resistance R and electrostatic capacity C.

The resonance-point tracking type drive apparatus is partially embodied by utilizing a sensor which detects the oscillation state of the piezoelectric oscillator in a similar manner to a conventional piezoelectric motor. However, in other motors, there does not exist a sensor which can optimally detect the oscillation state; thus, the drive frequency is changed by detecting the drive voltage, motor's temperature, and so on, however, in this case, it is difficult to completely track the resonance point.

In the case where the piezoelectric oscillator is utilized as a sensor as in an oscillation-type gyroscope, the damping capacity Cd of the piezoelectric oscillator utilized for a detection purpose can be equivalently reduced or eliminated by utilizing the inductance Ld. However, since the equivalently decreasing effect is a function of the frequency, it is greatly affected by the drive frequency. Moreover, as already has been mentioned, the inductance is generally difficult to be adjust and an electronic part therefor tends to be large-sized compared to other electronic parts.

When the piezoelectric oscillator is used as a filter, the inductance Ld is connected to an input-output terminal so as to achieve a wider bandwidth. However, there are constraints such that it is difficult to make the inductor small-sized and the effect of inductance is effective only at a specific frequency.

The electrostatic transducer serving as an electrostatic-type transducer means the same thing as a piezoelectric oscillator, includes planar electrodes disposed counter to each other with a narrow space therebetween. When the voltage is applied to the space between the electrodes, an operation is performed such that the distance between the electrodes is changed; conversely, when an external force is applied in a manner in which the distance between the electrodes is changed, the voltage between the electrodes is changed. An equivalent circuit in the drive and operation detection for the electrostatic transducer is the same as one in the piezoelectric oscillator. Therefore, in the electrostatic transducer, there also exist the same problems as in the piezoelectric oscillator where the capacitance component consumes the drive power and the capacitance component reduces detectivity in the detection apparatus.

SUMMARY OF THE INVENTION

In view of the foregoing drawbacks, it is therefore an object of the present invention to provide a capacitive-component reducing circuit capable of reducing and further canceling out power losses related to a capacitive component of an electrostatic-type transducer means without use of inductance, to provide a drive equipment capable of driving the electrostatic-type transducer means in a power saving manner, and to provide a detection apparatus capable of detecting the oscillation of the electrostatic-type transducer means in a highly sensitive manner.

It is another object of the present invention to provide a drive apparatus which is able to constantly track a resonance frequency when the resonance frequency of the electrostatic-type transducer means fluctuates due to temperature change, drive-voltage change, and so on.

It is still another object of the present invention to provide a self-oscillation circuit including the electrostatic-type transducer means so that the electrostatic-type transducer means can be driven at a resonance frequency or anti-resonance frequency.

A capacitive-component reducing circuit according to the present invention is characterized in that there is provided an amplifier which amplifies a voltage applied to a first side of the electrostatic-type transducer means, and there is provided a path connected from an amplifying output end of this amplifier to the first side of the electrostatic-type transducer means via an electrostatic capacity so that the capacitive component of the electrostatic-type transducer means is minimized.

The electrostatic-type transducer means is represented by, for example, a piezoelectric oscillator which is an electrostriction transducer or an electrostatic transducer in which planar electrodes are disposed counter to each other with a small space therebetween, etc. The capacitive component is a damping capacity in the case of the piezoelectric oscillator, while it is a capacitive component between the electrodes disposed counter to each other in the case of the electrostatic transducer.

In the above case, it is preferred that the amplification degree of the amplifier be approximately (N+1) times the capacitive component of the electrostatic-type transducer means if electrostatic capacity is approximately 1/N times the capacitive component of the electrostatic-type transducer means.

In this case, if a voltage at the one side of the electrostatic-type transducer means is denoted by V, a voltage at the output terminal of the amplifier that is the voltage applied to the electrostatic-type transducer means and electrostatic capacity mutually configured in series is V (N+1).

If the electrostatic-type transducer means is a piezoelectric oscillator, the electrostatic capacity can be formed by the same material constituting this piezoelectric oscillator.

According to the present invention, there is provided a drive apparatus including a path through which a drive power is supplied to the electrostatic-type transducer means; and the capacitive-component reducing circuit, wherein the amplifier in the capacitive-component reducing circuit is provided in a position where the drive power supplied to the electrostatic-type transducer means via the path, is amplified.

In a first embodiment, there is constructed a loop circuit in which the drive power is first supplied to an end of the electrostatic-type transducer means and then from said the end a path returns to the end via an amplifier and electrostatic capacity Cs. Alternatively, in a second embodiment, a path in which the drive power is supplied to an end of the electrostatic-type transducer means is connected and arranged in parallel to a path in which the drive power arrives at the end via the amplifier and electrostatic capacity. The first embodiment is essentially the same as the second embodiment. However, if the loop circuit is configured as shown in the first embodiment oscillation may occur in the event that a frequency in use becomes high and the amplification factor of the amplifier becomes also high. Thus, it is preferred that, in the case where the passage through which the drive power is supplied to the electrostatic-type transducer means is provided in parallel to a passage having the amplifier and electrostatic capacity, at between a supply side of the drive power and the electrostatic-type transducer means, a voltage holding means be provided in the passage where the drive power is supplied to the electrostatic-type transducer means.

Moreover, there are provided: a current phase detection means for detecting a current phase flowing through the electrostatic-type transducer means; a phase comparator for comparing the current phase detected by the current phase detection means and a voltage phase of the drive power supplied to the electrostatic-type transducer means; a filter which filters out a high frequency component of the phase comparator; and a voltage control oscillator which variable-controls an oscillation frequency based on an output voltage obtained after a filtering-out operation by the filter, so that the drive power is supplied based on the oscillation frequency of said voltage control oscillator and the electrostatic-type transducer means is driven at a resonance frequency.

In the above case, when the electrostatic-type transducer means is a piezoelectric oscillator, the oscillation frequency of the voltage control oscillator is variable-controlled in a manner such that phase difference compared by the phase comparator between the current phase and voltage phase is zero.

Next, a detection apparatus according to the present invention is characterized in that an electric output is obtained from the electrostatic-type transducer means which is oscillated by an external force and there is provided the capacitive-component reducing circuit therein.

Moreover, the drive apparatus according to the present invention has a frequency selection circuit including a capacity component and resistance component in the electrostatic-type transducer means and an amplifier where this selection frequency circuit is provided in a positive feedback loop, and is characterized in that the self-oscillation is performed at a frequency determined by the frequency selection circuit.

In the above case, said frequency selection circuit includes a first resistor and first capacitor connected in series within the positive feedback loop of said amplifier, and a second resistor and second capacitor connected in parallel and connected to a noninverting input side of the amplifier, and it can be configured in a manner that either the first resistor and first capacitor or the second resistor and second capacitor corresponds to a capacitive component and resistance component of the electrostatic-type transducer means.

Specifically, the configuration will be such that the first capacity and first resistor are connected in series in the positive feedback loop of the amplifier, that either the piezoelectric oscillator or the electrostatic-type transducer means such as an electrostatic transducer is connected to a noninverting input side of the amplifier and that the self-oscillation occurs at a frequency determined by the first capacitor and first resistor and the capacity component and resistance component of the electrostatic-type transducer means which becomes a driving state in the vicinity of a resonance point. Alternatively, the configuration may be such that the electrostatic-type transducer means is connected to the positive feedback loop of the amplifier, that the second capacitor and second resistor connected in parallel to each other are connected to the noninverting input side of the amplifier, and that the self-oscillation occurs at a frequency determined by the capacity component and resistance component of the electrostatic-type transducer means which becomes a driving state in the vicinity of anti-resonance point as well as the second capacitor and second resistor.

Moreover, it is preferred that the configuration be such that the capacity component and resistor component are connected to the electrostatic-type transducer means.

Moreover, in the above case, it is preferred that in the negative feedback loop of the amplifier there be provided an amplitude stabilizing circuit including a resistor which determines the amplification factor of the amplifier.

In the capacitive-component reducing circuit according to the present invention, the voltage supplied at one side of the electrostatic-type transducer means such as a piezoelectric oscillator or the voltage generated at the side is amplified by the amplifier so that this amplified voltage applies to the electrostatic capacity connected in series to the electrostatic-type transducer means. Therefore, the presence of the current flowing through the electrostatic capacity cancels out a capacitive component of the electrostatic-type transducer means, for example a damping capacity of the piezoelectric oscillator, so that the work of the capacitive component of the electrostatic-type transducer means can be minimized.

In the above case, when the amplification degree of the amplifier is set to a factor of approximately (N+1) while the electrostatic capacity is approximately 1/N times the capacitive component of the electrostatic-type transducer means, that is, when the voltage applied to the electrostatic-type transducer means and electrostatic capacity is set to V(N+1) while the voltage supplied to one side of the electrostatic-type transducer means or the voltage generated at the side is defined as V, the capacitive component of the electrostatic-type transducer means can be almost completely canceled out. Even if the electrostatic capacity is not strictly matched up with this value, such capacitive-component reducing effect can be obtained.

In the case where the electrostatic-type transducer means is a piezoelectric oscillator, the electrostatic capacity can be made of the same material as that of the piezoelectric oscillator. In this case, the piezoelectric oscillator and electrostatic capacity are both in an equivalent situation against the environmental conditions such as temperature, therefore, the capacitive component can be further effectively reduced.

In the drive apparatus according to the present invention, an A.C. drive power is provided in one side (one of the electrodes) of the electrostatic-type transducer means such as a piezoelectric oscillator. The drive power is amplified by the amplifier in a different path from that where the drive power is supplied, and this amplified voltage is applied to the electrostatic capacity connected at the side. By this capacitive-component reducing circuit, the capacitive component of the electrostatic-type transducer means is minimized or canceled out, so that the capacitive component consumes no power, thus achieving a power-saving drive operation.

Moreover, in the case where the path supplying the drive power to the electrostatic-type transducer means and the path containing the amplifier and electrostatic capacity are provided in parallel to each other and interposed between the supply side of the drive power and the electrostatic-type transducer means, provision of the voltage holding means such as a voltage follower in the path supplying the drive power to the electrostatic-type transducer means enables the realization of the stabilized driving operation without causing the oscillation.

The electrostatic-type transducer means can be driven constantly at a resonance frequency or anti-resonance frequency if the frequency of the drive power is variable-controlled in a manner such that the phase of the drive voltage supplied to the electrostatic-type transducer means and the phase of the current flowing into the electrostatic-type transducer means are compared so that the phase difference of the voltage and current is set to 0, for example, in the case of the piezoelectric oscillator. Therefore, even if the resonance frequency or anti-resonance frequency of the electrostatic-type transducer means fluctuates, the drive power constantly tracks the fluctuation of this frequency.

Moreover, in the drive apparatus of the electrostatic-type transducer means according to the present invention, there is provided an amplifier (op-amp) and there is provided a frequency selection circuit in a positive feedback loop (positive feedback path) of the amplifier, and the frequency selection circuit contains a capacity component and resistance component of the electrostatic-type transducer means, more specifically, the capacity component and resistance component of the electrostatic-type transducer means which is in the state of the resonance (series resonance) or anti-resonance (parallel resonance), so that the self-oscillation operation can be performed in the vicinity of the resonance point or anti-resonance point of the electrostatic-type transducer means.

This drive apparatus is one employing the principle of the Wien-bridge oscillator circuit. The frequency selection circuit in this oscillator circuit may be constituted by, for example, a first capacitor and first resistor, connected in series to each other, contained in the positive feedback loop of the amplifier; and a second capacitor and second resistor, connected in parallel to each other, which are connected to the noninverting input side of the amplifier. Here, there can be constructed a self-oscillation circuit whose operating frequency is determined by the capacity component and resistance component of the electrostatic-type transducer means in a manner such that either the first capacitor and first resistor or the second capacitor and second resistor are replaced by the electrostatic-type transducer means driven in the vicinity of the resonance point or anti-resonance point.

Moreover, in the above frequency selection circuit, the first and second capacitors function as a high-pass filter and low-pass filter, respectively, so as to construct a band-pass filter between the input and output of the amplifier, thus the frequency for the self-oscillation is determined. Here, there may be caused a case where there exists a difference between the resonance frequency or anti-resonance frequency of the electrostatic-type transducer means such as a piezoelectric oscillator and the self-oscillation's frequency determined by said frequency selection circuit. Thus, an additional capacity and additional resistance are connected in parallel or in series to the electrostatic-type transducer means and then this additional capacity and additional resistance plays a role to adjust a cut-off frequency of said low-pass filter and high-pass filter, as a result thereof, the self-oscillation operation can be performed at either the resonance frequency or anti-resonance frequency of the electrostatic-type transducer means.

Moreover, provision of an amplification-factor-determining resistor in the negative feedback loop of the amplifier can stabilize the amplitude of the self-oscillation.

DESCRIPTION OF THE PREFERRED EMBODIMENT

A piezoelectric oscillator or an electrostatic transducer in which planar electrodes are arranged counter to each other can be used as examples of an electrostatic-type transducer means. In the following embodiments, the electrostatic-type transducer means will be described utilizing the piezoelectric oscillator as an example to begin with.

Figure 1:
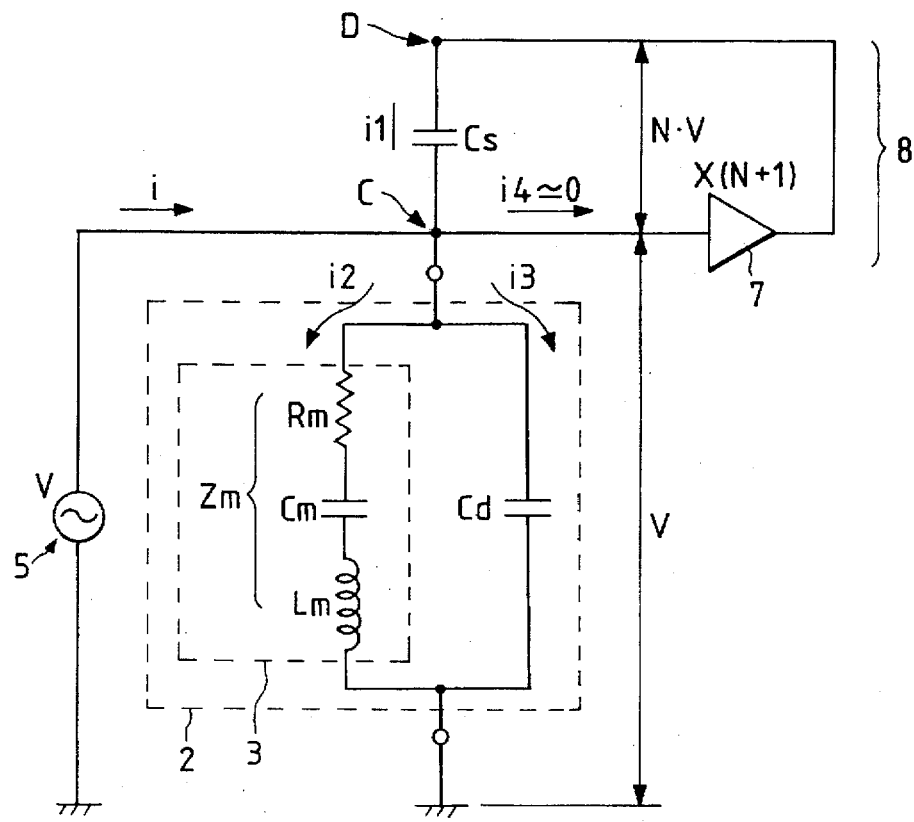
FIG. 1 is an equivalent circuit diagram showing a drive apparatus of a piezoelectric oscillator according to an embodiment of the present invention.

FIG. 1 is an equivalent circuit diagram showing a drive apparatus of the piezoelectric oscillator according to an embodiment of the present invention.

Referring to FIG. 1, a first electrode of a piezoelectric oscillator 2 (indicated in an equivalent circuit where it is in the state of being oscillated in the vicinity of a resonance point) is connected to the ground, while a second electrode (at one side in the present invention) is connected to an A.C. drive power source 5. An amplifier 7 is connected to the second electrode, where a voltage applied to this second electrode, i.e., a voltage V supplied from the A.C. drive power source 5, is amplified at a (N+1) times gain, where N is a positive number. At an amplifying output end of this amplifier 7, a capacitor having electrostatic capacity Cs is connected in series. This electrostatic capacity Cs is connected in series to the piezoelectric oscillator 2 at the second electrode, and a loop circuit 8 (a capacitive-component reducing circuit) including this amplifier and Cs is connected at a point C. A capacity value of the electrostatic capacity Cs is approximately 1/N times the damping capacity Cd of the piezoelectric oscillator 2. This loop circuit 8 is a capacitive-component (damping capacity) reducing circuit according to the present invention.

In FIG. 1, a supply current supplied from the A.C. drive power source 5 is denoted as i, a current flowing through the electrostatic capacity Cs as i1, an impedance for a series resonance side 3 of the piezoelectric oscillator 2 as Zm and the current flowing therethrough as i2, a current flowing through the damping capacity Cd as i3, and a current flowing through the amplifier 7 as i4.

Since a drive voltage V from the A.C. drive power source 5 is applied at the point C, the potential of a point D will be (N+1)V due to the amplifier 7. Hence, the voltage equal to N·V is applied between points D and C (D–C). Because the impedance at D–C is $1/(j\omega Cs)$, i1 can be expressed by equation 6, where $\omega$ is an angular frequency.

(Equation 6)

$$i1 = j\omega Cs \cdot N \cdot V$$

Similarly, i2 and i3 can be expressed by equations 7 and 8, respectively.

(Equation 7)

$$i2 = V/Zm$$

(Equation 8)

$$i3 = j\omega Cd \cdot V$$

If i4 is not accounted for because i4 is a very small current, i can be expressed by equation 9.

(Equation 9)

$$i = i2 + i3 - i1$$

Substituting equations 6, 7 and 8 into equation 9 results in equation 10.

(Equation 10)

$$i = V/Zm + j\omega(Cd - N \cdot Cs) \cdot V$$

Here, if equation 11 holds, (Equation 11)

$$Cs = Cd/N$$

i will equal the right-hand side term of equation 7, and i will equal i2. Namely, the supply current supplied from the A.C. drive power source 5 will solely account for a quantity flowing into the impedance Zm of the series resonance side 3 and no current is supplied to the damping capacity Cd which does not contribute to the oscillation.

Figure 2:
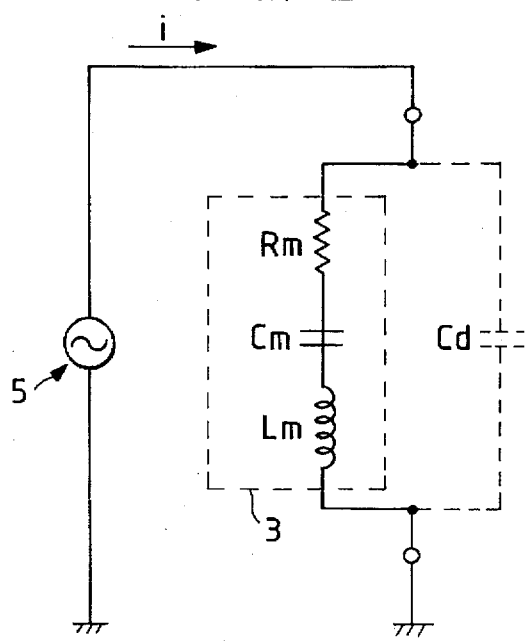
FIG. 2 is an equivalent circuit diagram showing a state in which a damping capacity component of the piezoelectric oscillator shown in FIG. 1 is equivalently canceled out.
Figure 3A:
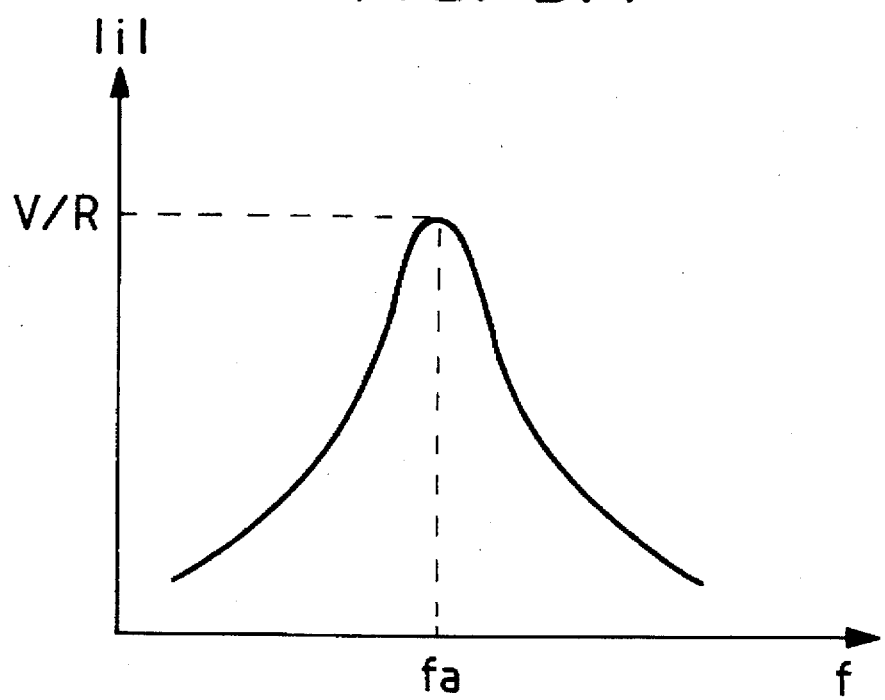
FIG. 3A and FIG. 3B are graphs showing frequency characteristics for a current gain and phase associated with the piezoelectric oscillator shown in FIG. 1.
Figure 3B:
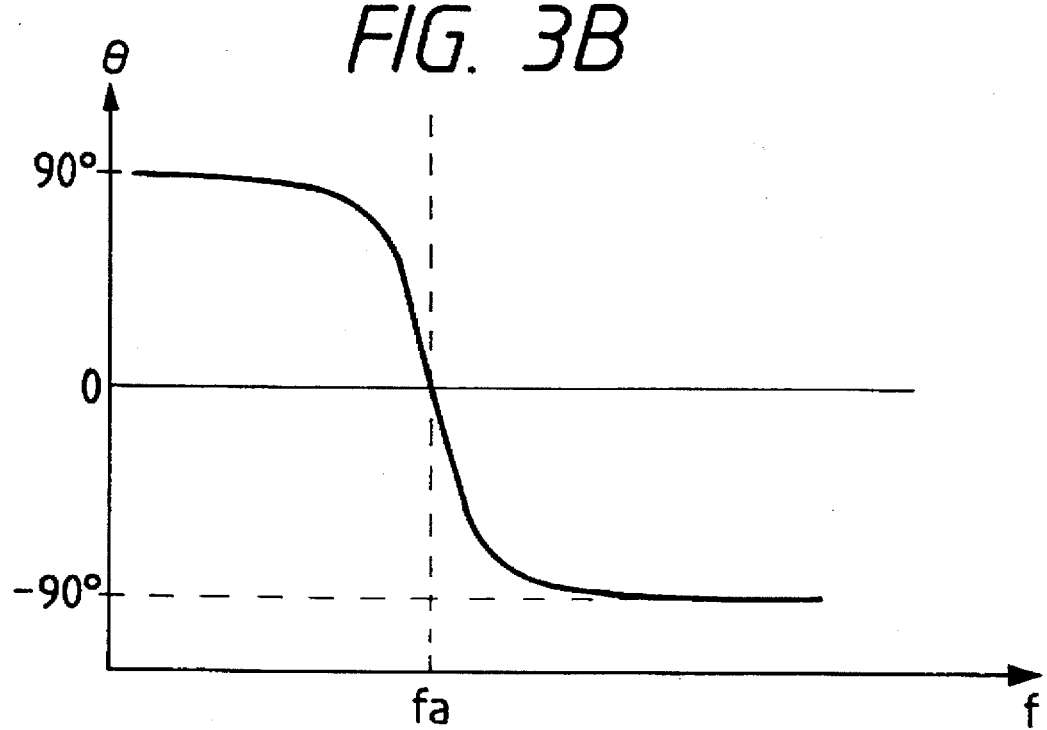

Since a damping capacity Cd component of the piezoelectric oscillator is equivalently canceled out, the equivalent circuit corresponding to this state of the piezoelectric oscillator will be a circuit consisting of the series resonance side 3 only shown in FIG. 2. A gain characteristic for the then supply current i supplied from the A.C. drive power source 5 is expressed by equation 12, a resonance point fa by equation 13, and a phase characteristic by equation 14. FIG. 3A shows a frequency characteristic for the gain of the then supply current i, while FIG. 3B shows a frequency characteristic for the phase of the supply current i.

$$i = V/Zm = V/\{Rm + j(\omega Lm - 1/\omega Cm)\} \quad \text{(Equation 12)}$$
$$= V \cdot e^{j\theta}/[\sqrt{\{Rm^2 + (\omega Lm - 1/\omega Cm)^2\}}\,]$$

(Equation 13)

$$fa = 1/\{2\pi\sqrt{(Lm \cdot Cm)}\}$$

(Equation 14)

$$\theta = -\tan^{-1}\{(\omega Lm - 1/\omega Cm)/Rm\}$$

A condition for which the current flowing through the damping capacity Cd is canceled out is to satisfy the equation 11, namely, the electrostatic capacity Cs is 1/N times the damping capacity Cd. This condition is given by a function of the electrostatic capacity Cs and a gain N of the amplifier 7, and does not involve a function of the drive frequency of the A.C. drive power source 5. Therefore, the frequency dependency is not included in the condition for canceling out the damping capacity Cd. As for adjustment of the electrostatic capacity Cs in the course of canceling out the damping capacity Cd, it will be far easier than the adjustment of an inductance L and compactness can be achieved even by utilizing a varicap- or trimmer-type variable electrostatic capacity. Moreover, a similar advantageous effect can be obtained if the gain N is adjusted by variable resistance while the electrostatic capacity Cs is fixed, thus further compactness can be achieved. There of course can be achieved an advantageous effect in which the influence of the damping capacity Cd can be reduced even if the electrostatic capacity Cs to be implemented and the gain of the amplifier 7 are not perfectly matched with the condition set forth in equation 11.

A physical electronic member realizing the electrostatic capacity Cs may be made of the same material constituting the piezoelectric oscillator 2. Part of the material constituting the piezoelectric oscillator may not be polarization-performed and such a portion may be used as the electrostatic capacity Cs. Thus, part of the same material is polarization-performed so as to function as a piezoelectric oscillator while part of another portion is not polarization-performed so as to function as an electrostatic capacity Cs, so that it is no longer necessary to especially provide an element serving as the electrostatic capacity Cs. Therefore, not only is cost efficiency achieved, but also the number of necessary parts can be reduced, so that an apparatus can be made further compact-sized. It suffices that the amplifier 7 is a means for amplifying the voltage, and the amplifier 7 may be constituted by a transistor, op-amp, transformer and so on.

Figure 5:
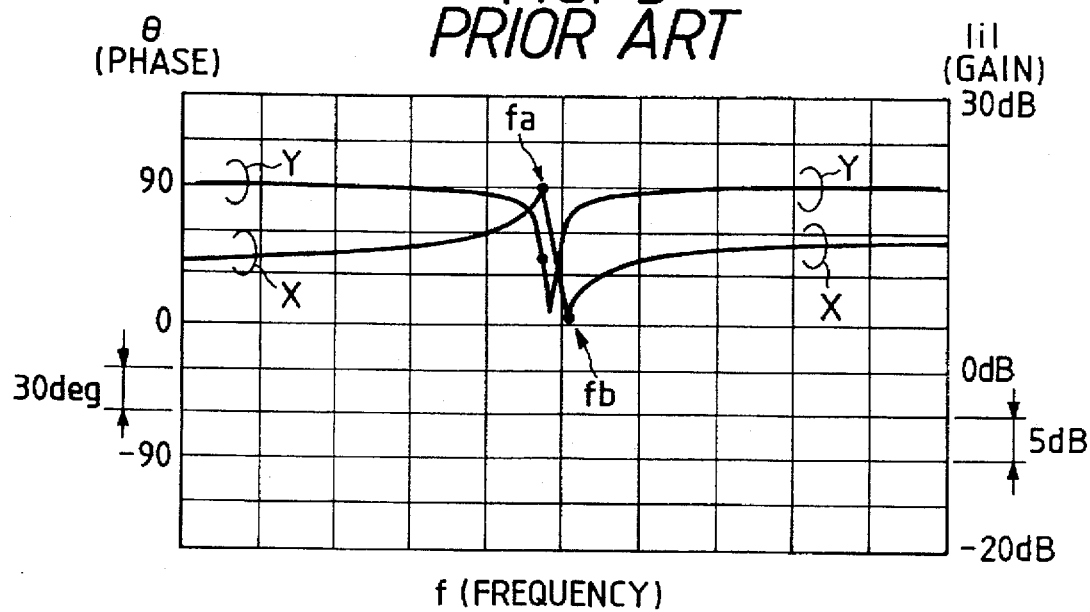
FIG. 5 is a graph showing an experimental result in the conventional piezoelectric oscillator's drive apparatus.
Figure 7:
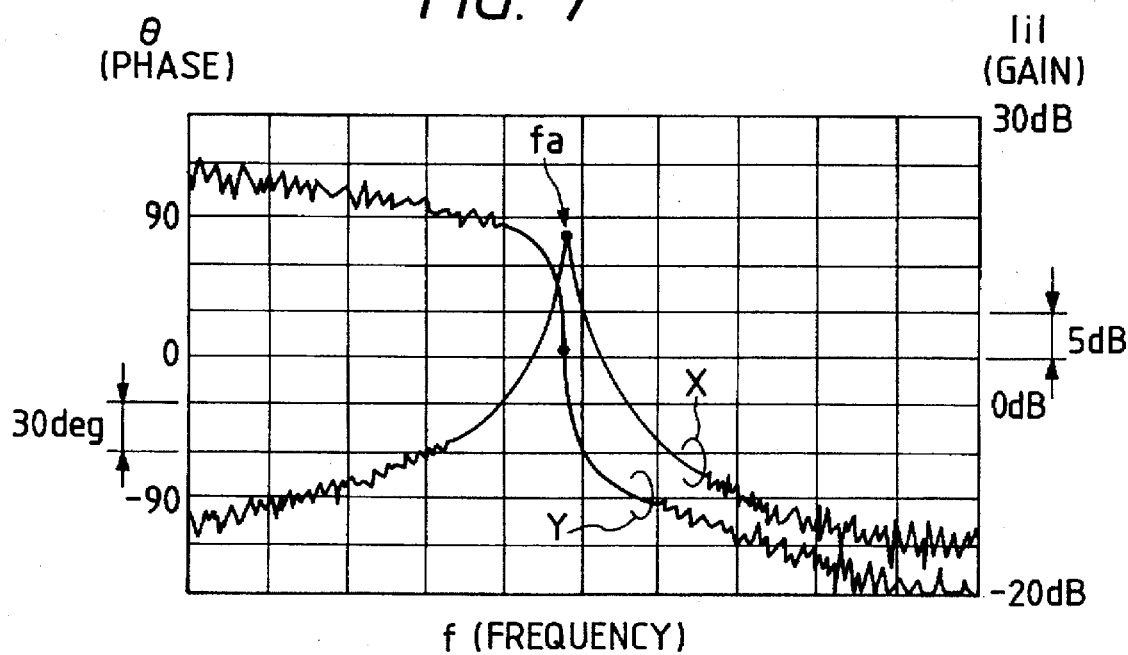
FIG. 7 is a graph showing an experimental result in the piezoelectric oscillator's drive apparatus according to the present invention.

FIG. 5 and FIG. 7 illustrate experimental results in the conventional circuit and in an embodiment of the present invention, respectively.

Figure 8:
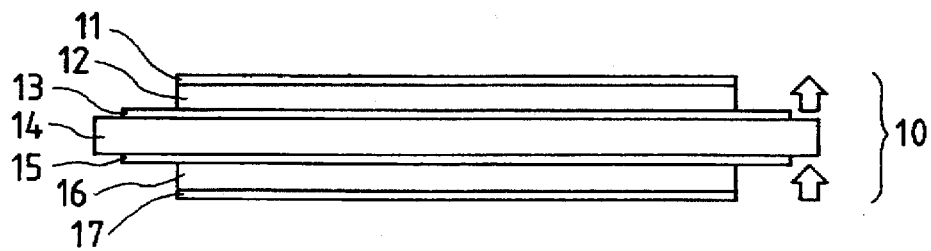
FIG. 8 is a side view showing the structure of the piezoelectric oscillator used for the experiment in the present invention.

FIG. 8 indicates deposition members 10 of the piezoelectric oscillator used in the experiment. Referring to FIG. 8, an electrode 13, piezoelectric material 12 and drive electrode 11 are deposited on a first face of a glass substrate 14, while an electrode 15, piezoelectric material 16 and a detection electrode 17 are similarly deposited on a second face of the glass substrate 14. The dielectric polarization direction of the piezoelectric material 12 and 16 is indicated with arrow marks shown in FIG. 8.

Figure 4:
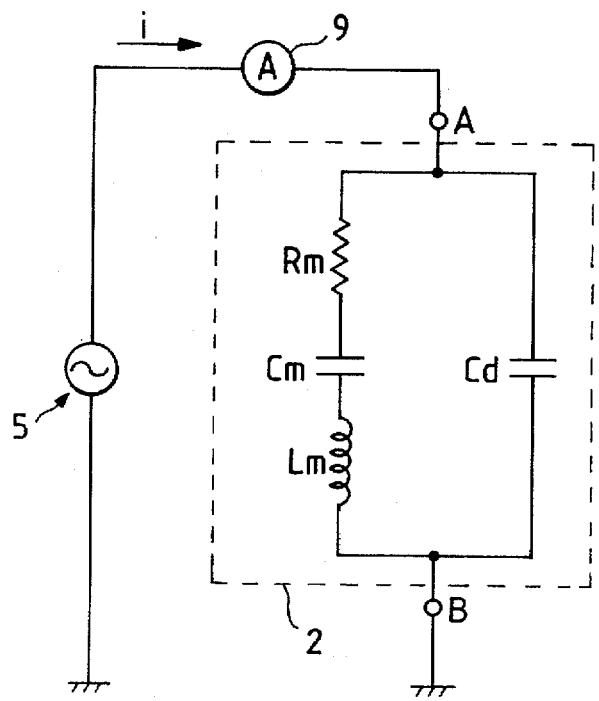
FIG. 4 is an equivalent circuit diagram showing the conventional piezoelectric oscillator's drive apparatus used for an experimental purpose.

FIG. 5 shows the result of the experiment utilizing a conventional circuit in which the loop 8 (capacitive-component reducing circuit) according to the present invention is not implemented. FIG. 4 is an experimental circuit utilizing the conventional circuit, and FIG. 5 indicates an output detected by an ammeter 9 shown in FIG. 4. Referring to FIG. 4, an electrode of the piezoelectric oscillator 2 is connected to the ground while another electrode thereof is connected to an A.C. drive power source 5, and the ammeter 9 is connected and interposed between the piezoelectric oscillator 2 and A.C. drive power source 5. The piezoelectric oscillator 2 used in the experiment was the deposition members 10 shown in FIG. 8, and the drive electrode 11 of the deposition members 10 is connected to a terminal A of the experimental circuit shown in FIG. 4 while the electrode 13 of the deposition members 10 is connected to a terminal B of the experimental circuit shown in FIG. 4.

FIG. 5 shows a graph whose axis of abscissa indicates the frequency of the drive power supplied from the A.C. drive power source 5 and whose axis of ordinate indicates a gain (dB) of a supply current i supplied from the A.C. drive power source, and also indicates a phase θ (deg) of the supply current i. An output X indicates a gain characteristic, and the maximum thereof occurs at a resonance point fa while the minimum thereof occurs at an anti-resonance point fb. An output Y indicates a phase characteristic and the supply current i is a phase forward by 90 degrees more than a drive voltage phase in the frequencies excluding those in the vicinity of the resonance point fa and anti-resonance point fb, under the influence of the damping capacity Cd.

Figure 6:
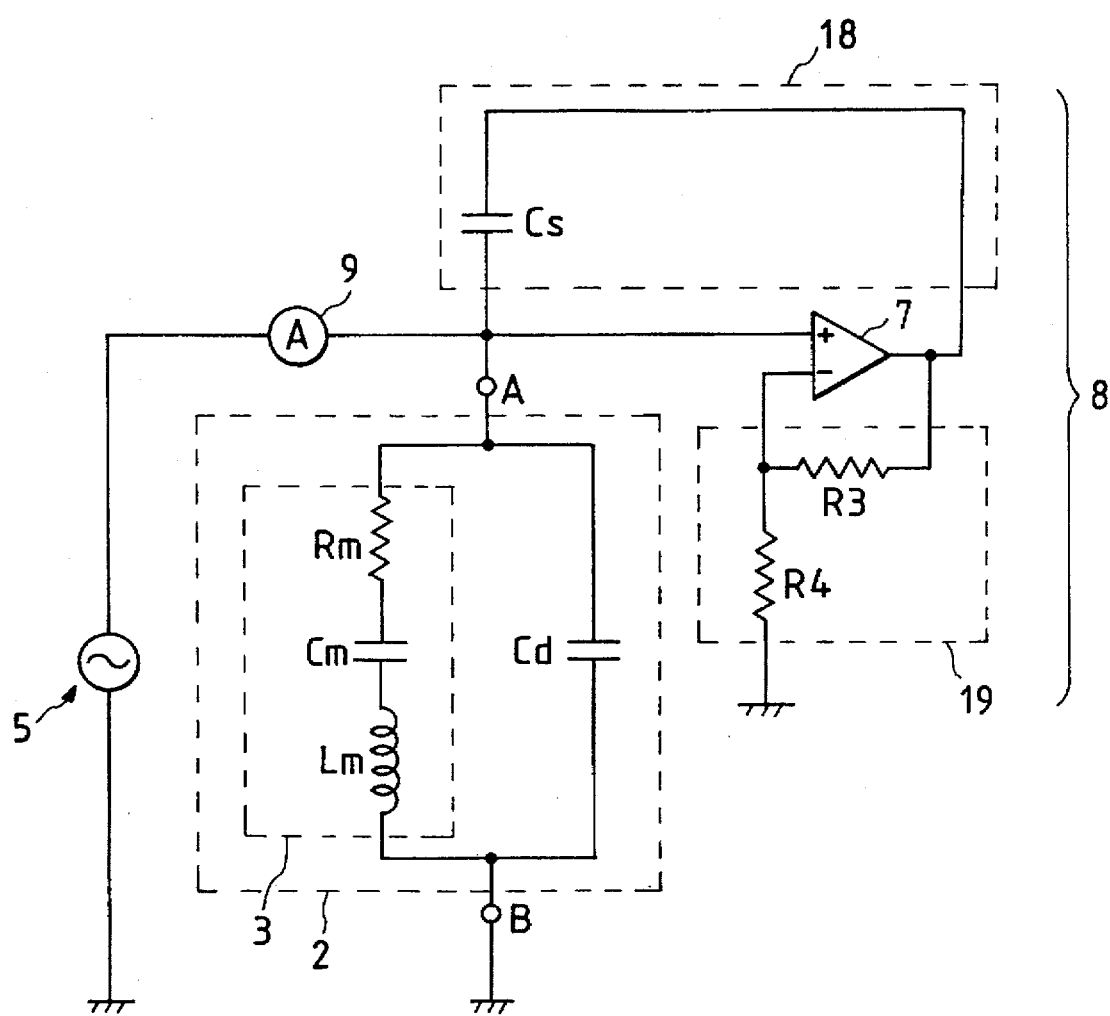
FIG. 6 is an equivalent circuit diagram of an piezoelectric oscillator's drive apparatus according to the present invention for an experimental purpose.

FIG. 7 shows the result of the experiment utilizing a circuit in which the loop 8 (capacitive-component reducing circuit) according to the present invention is implemented. FIG. 6 shows the experimental circuit while FIG. 7 shows an output detected by an ammeter shown in FIG. 6. Referring to FIG. 6, an electrode of the piezoelectric oscillator 2 is connected to the ground while another electrode of the piezoelectric oscillator 2 is connected to the A.C. drive power source 5, so that the drive power is supplied from the terminal A to the piezoelectric oscillator 2. In the loop circuit 8 serving as the capacitive-component reducing circuit, a voltage at the terminal A is amplified by the amplifier 7 by a factor of N+1 in a supply path of the drive power. The electrostatic capacity Cs is connected in series at an amplifying output end of the amplifier 7 and is connected to the terminal A. The electrostatic capacity Cs is set to approximately 1/N times the damping capacity Cd.

The ammeter 9 is connected and interposed between the piezoelectric oscillator 2 and A.C. drive power source 5. The deposition members 10 are used for the piezoelectric oscillator used in the experiment, and the drive electrode 11 of the deposition members 10 is connected to the terminal A of the experimental circuit while the electrode 13 of the deposition members 10 is connected to the terminal B of the experimental circuit. An apparatus according to the embodiment shown in FIG. 6 is comprised of the amplifier 7 being an op-amp, a negative feedback circuit block 19 including a resistor R3 and R4 which set a gain of voltage amplification and a positive feedback circuit block 18 including the electrostatic capacity Cs. Each parameter is set as indicated by equation 15 and equation 16.

(Equation 15)

$$N+1=1+(R3/R4)$$

(Equation 16)

$$Cs=Cd/N$$

FIG. 7 shows a graph whose axis of abscissa indicates a frequency and whose axis of ordinate indicates a gain (dB) of a supply current i supplied from the A.C. drive power source and also indicates a phase θ (deg) of the supply current i. An output X indicates the gain characteristic. The damping capacity Cd is equivalently canceled, and the gain takes the maximum value at the resonance point fa. An output Y indicates the phase characteristic. Referring to FIG. 7, it is clarified that the phase becomes almost zero at the resonance point fa and with this boundary point the current phase becomes a phase forward by approximately 90 degrees and then becomes a phase behind by approximately 90 degrees relative to the drive voltage phase.

Comparing the output characteristics in FIG. 5 and FIG. 7 confirms that a component of the damping capacity Cd can be equivalently canceled out by adding the loop circuit 8 (capacitive-component reducing circuit) shown in FIG. 6 and that the drive power can be reduced by as much as the power consumed by for the damping capacity Cd applied from the A.C. drive power source 5.

Figure 9:
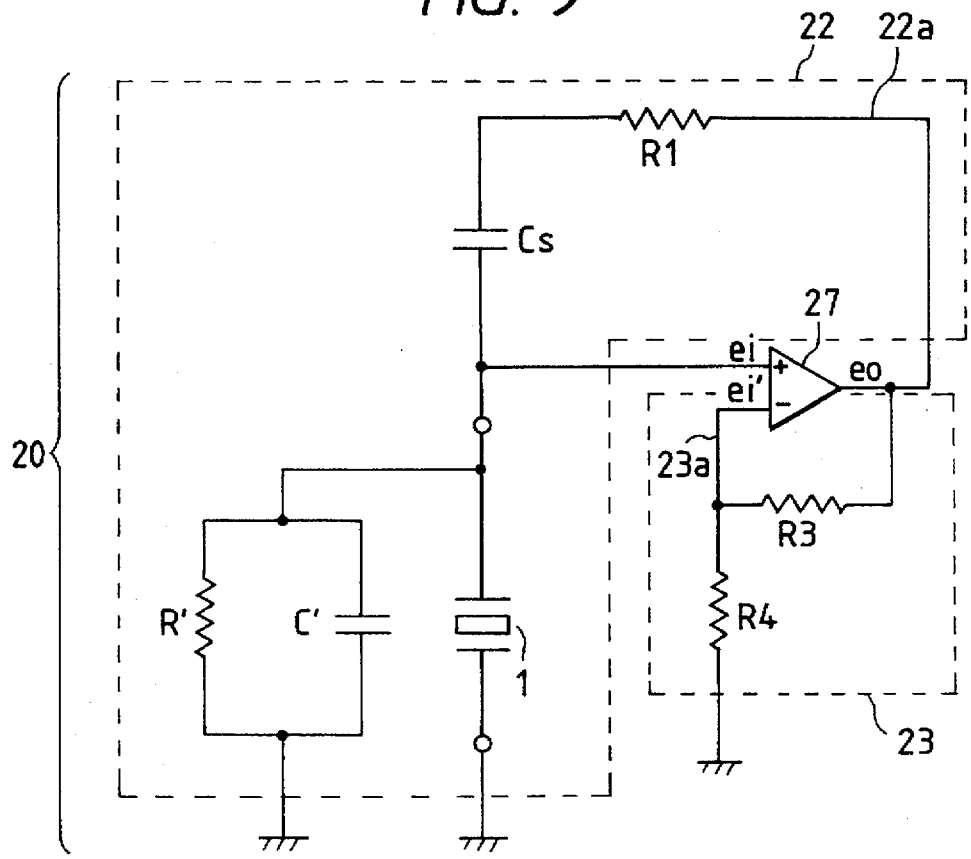
FIG. 9 is an equivalent circuit diagram showing a drive apparatus of a self-oscillation-type piezoelectric oscillator according to an embodiment of the present invention.
Figure 11:
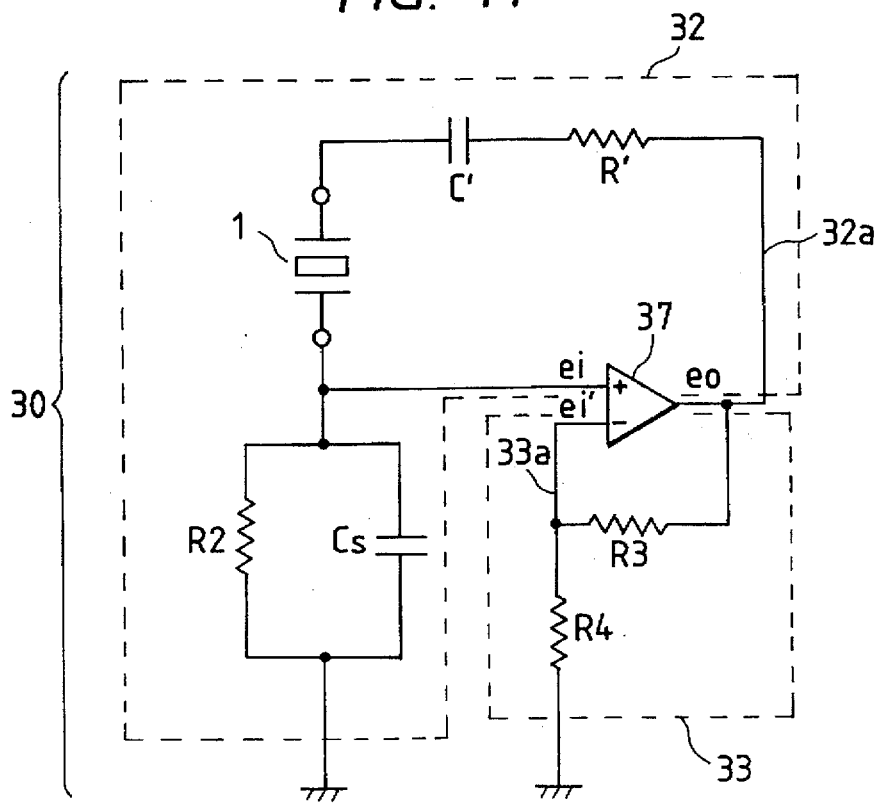
FIG. 11 is an equivalent circuit diagram showing a drive apparatus of a self-excited oscillating type piezoelectric oscillator according to another embodiment of the present invention.

FIG. 9 and FIG. 11 show the drive apparatus of the piezoelectric oscillator which constitutes a self-oscillation circuit 20 according to embodiments of the present invention.

The apparatus according to the embodiment shown in FIG. 9 is comprised of an amplifier 27 being an op-amp, a negative feedback circuit block 23, connected thereto, including resistors R3 and R4 which set a gain of voltage amplification and a positive feedback circuit block 22, connected to the block 23 via the amplifier 27, including an electrostatic capacity Cs, resistor R1 and piezoelectric oscillator 1.

Referring still to FIG. 9, the positive feedback circuit block 22 is a frequency selection circuit in which the electrostatic capacity Cs is connected in series to the resistor R1, and this series-connected electrical line is connected into a positive feedback path (positive feedback loop) 22a of the amplifier 27, that is, into a path connecting an output side and a noninverting input side of the amplifier 27. An electrode of the piezoelectric oscillator 1 is input to the noninverting input side of the amplifier 27 while another electrode of the piezoelectric oscillator 1 is connected to the ground. A negative feedback circuit block 23 is an amplitude stabilizing circuit which sets up a gain of the voltage amplification, in which there is provided a negative feedback path 23a (negative feedback loop) connected to an inverting-side input terminal of the amplifier 27 via the resistor R3 while the resistor R4 is connected to and interposed between the noninverting input side of the amplifier 27 and the ground.

Figure 10A:
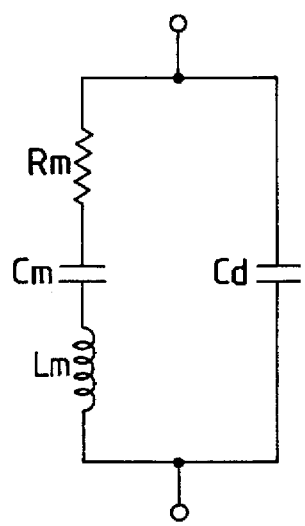
FIG. 10A and FIG. 10B are equivalent circuit diagrams for the piezoelectric oscillator shown in FIG. 9 in the vicinity of a resonance point.

FIG. 10A is an equivalent circuit obtained when the piezoelectric oscillator is being driven in the vicinity of the resonance point fa. In the resonance point fa, Lm and Cm are of series resonance and are equivalent to a state shown in FIG. 10B. The resonance point fa for the equivalent circuit shown in FIG. 10B can be obtained by equation 17.

(Equation 17)

$$fa=1/2\pi\sqrt{(LmVCm)}$$

Meanwhile, in a circuit shown in FIG. 9 (a circuit is assumed to have no additional resistor R' and additional capacity C' ) the piezoelectric oscillator 1 is replaced by the series-resonance equivalent circuit, and the thus circuit is analyzed. A result thereof will be described hereinbelow.

If a voltage at the noninverting input terminal in the amplifier 27 is defined as ei, a voltage of the inverting input terminal as ei' and the output voltage as eo, the relationship expressed by equation 18 and equation 19 holds as follows.

(Equation 18)

$$ei=eo/\{(1+R1/Rm+Cd/Cs)+j(\omega CdR1-1/\omega CsRm)\}$$

(Equation 19)

$$ei'=\{R4/(R3+R4)\}\cdot eo$$

If the amplification degree of the amplifier 27 (op-amp) is sufficiently large, the relationship of equation 20 holds. Then, substituting equation 18 and equation 19 into equation 20 results in equation 21.

(Equation 20)

$$ei=ei'$$

(Equation 21)

$$R4/(R3+R4)=1/\{(1+R1/Rm+Cd/Cs)+j(\omega CdR1-1/\omega CsRm)\}$$

From equation 21, the oscillation condition for the drive circuit 20 of the piezoelectric oscillator 1 will be such that the amplitude condition is represented by equation 22 and the frequency condition by equation 23.

(Equation 22)

$$(R3+R4)/R4=1+R1/Rm+Cd/Cs$$

(Equation 23)

$$\omega CdR1=1/\omega CsRm$$

Here, each parameter such as R1, R3, R4 and Cs satisfying the above-described amplitude condition and frequency condition is selected so that the circuit 20 becomes a self-oscillation circuit oscillating in the resonance point fa of the piezoelectric oscillator.

Figure 10B:
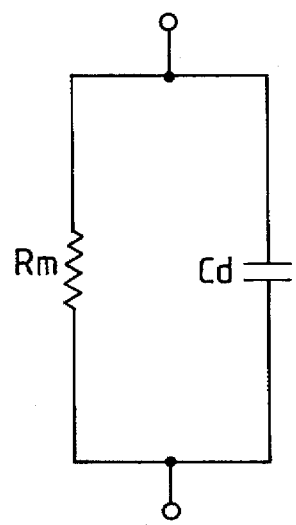

Namely, this self-oscillation circuit is one employing the principle of the Wien-bridge oscillator circuit. In the Wien-bridge oscillator circuit, the positive feedback is applied to the amplifier (op-amp) 27 so as to generate oscillation, and this self-oscillation frequency is determined by the positive feedback circuit block 22 serving as a frequency selection circuit. In the positive feedback circuit block 22 (frequency selection circuit), the first capacity Cs and first resistor R1 are connected in series within the positive feedback loop, and the Cd and Rm of the piezoelectric oscillator 1 whose equivalent circuit is shown in FIG. 10B serve as the second capacity and second resistor, respectively. These are mutually connected in parallel and are connected to the noninverting input side of the amplifier 27. In the frequency selection circuit, the first capacity (electrostatic capacity) Cs functions as a high-pass filter while the second capacity (damping capacity) Cd functions as a low-pass filter. The self-oscillation frequency is determined by a band-pass filter comprised of the high-pass filter and low-pass filter in the positive feedback path of the amplifier 27.

The negative feedback circuit block 23 functions as the amplitude stabilizing circuit for the self-oscillation in a manner that the gain of the voltage amplification in the amplifier 27 is set to a sufficiently high level. Here, the resonance frequency of the piezoelectric oscillator 1 is determined by equation 17, that is, by the inductance component Lm and capacitive component Cm of the piezoelectric oscillator 1 during a motional period. There may occur a case in which this resonance frequency is not always matched with the self-oscillation frequency determined by the frequency selection circuit.

In this case, it is preferred that each capacity value and resistance value be adjusted or selected in a manner that there is provided the additional capacity C' and additional resistor R' connected in parallel to the piezoelectric oscillator 1, as shown in FIG. 9. In this case, the additional capacity C' operates in a manner that it adjusts a cut-off frequency of the low-pass filter, while the additional resistor R' operates in a manner that it adjusts a cut-off frequency of the high-pass filter. Consequently, correction is carried out so that the self-oscillation frequency of the self-oscillation circuit 20 can be matched with or approximated to the resonance frequency of the piezoelectric oscillator 1. Thus, it is preferred that the additional capacity C' and additional resistor R' shall be comprised of a freely variable element and/or the electrostatic capacity Cs and resistor R1 be comprised of a freely variable element.

Next, in an embodiment shown in FIG. 11, the amplifier 37 is an op-amp, and connected thereto are a negative feedback circuit block 33 including the resistors R3 and R4 which set the gain of the voltage amplification and a positive feedback circuit block 32 comprised of the electrostatic capacity Cs and the resistor R2 and the piezoelectric oscillator 1. The positive feedback circuit block 32 is a frequency selection circuit in which a positive feedback path (positive feedback loop) 32a including the piezoelectric oscillator is constructed, namely, there is constructed a path connecting an output side and noninverting input side of the amplifier 37; the piezoelectric oscillator 1 is connected within this path. The electrostatic capacity Cs and resistor R2 are mutually connected in parallel and are connected to the noninverting input side of the amplifier 37 and the ground. The negative feedback circuit block 33 is provided so as to stabilize the amplitude by setting the voltage amplification gain to a sufficiently high level, and there is constructed the negative feedback path 33a connected to the inverting input terminal of the amplifier 37 via the resistor R3. The resistor R4 is connected and interposed between the inverting input side of the amplifier 37 and the ground.

Figure 12A:
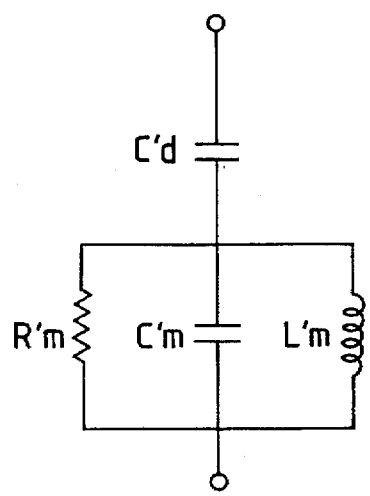
FIG. 12A and FIG. 12B are equivalent circuit diagrams for the piezoelectric oscillator shown in FIG. 11 in the vicinity of a anti-resonance point.
Figure 12B:

FIG. 12A is an equivalent circuit obtained when the piezoelectric oscillator 1 is being driven in the vicinity of the anti-resonance point fb. In the anti-resonance point fb, Lm' and Cm' are of parallel resonance and are equivalent to a state shown in FIG. 12B. The anti-resonance point fb for the equivalent circuit shown in FIG. 12B can be obtained by equation 24.

(Equation 24)

$$fb = 1/2\pi\sqrt{(Lm' \cdot Cm')}$$

Meanwhile, in a circuit shown in FIG. 11 (a circuit is assumed as having no additional capacity C' and no additional resistor R') the piezoelectric oscillator 1 is replaced by the parallel-resonance equivalent circuit and such circuit is analyzed. The result thereof will be described hereinbelow.

If a voltage at the noninverting input terminal in the amplifier 37 is defined as ei, a voltage of the inverting input terminal as ei' and the output voltage as eo, the relationship expressed by equation 25 and equation 26 is as follows.

(Equation 25)

$$ei = eo/\{(1+Rm'/R2+Cs/Cd') + j(\omega CsRm' - 1/\omega Cd'R2)\}$$

(Equation 26)

$$ei' = \{R4/(R3+R4)\} \cdot eo$$

If the amplification degree of the amplifier 37 (op-amp) is sufficiently large, relation of equation 27 holds. Then, substituting equation 25 and equation 26 into equation 27 results in equation 28.

(Equation 27)

$$ei = ei'$$

(Equation 28)

$$R4/(R3+R4) = 1/\{(1+Rm'/R2+Cs/Cd') + j(\omega CsRm' - 1/\omega Cd'R2)\}$$

From equation 28, the oscillation condition for the self-oscillation circuit 30 including the piezoelectric oscillator 1 will be such that the amplitude condition is represented by equation 29 and the frequency condition by equation 30.

(Equation 29)

$$(R3+R4)/R4 = 1 + Rm'/R2 + Cs/Cd'$$

(Equation 30)

$$\omega CsRm' = 1/\omega Cd'R2$$

Here, each parameter such as R2, R3, R4 and Cs satisfying the amplitude condition and frequency condition is selected so that this circuit becomes a self-oscillation circuit oscillating in the anti-resonance point fb of the piezoelectric oscillator.

The principle of the self-oscillation circuit shown in FIG. 11 can be represented by the Wien-bridge oscillator circuit which is the same as in that shown in FIG. 9. When in FIG. 11 the piezoelectric oscillator 1 is replaced by the equivalent circuit shown in FIG. 12B, the first capacity and first resistor will be Cd' and Rm', respectively, while the second capacity and second resistor will be Cs and R2, respectively. In that circuit, the damping capacity Cd' of the piezoelectric oscillator 1 operating in the vicinity of the anti-resonance point functions as a high-pass filter while the electrostatic capacity Cs functions as a low-pass filter.

Here, the anti-resonance frequency of the piezoelectric oscillator is determined by equation 24. However, there may occur a case in which this anti-resonance frequency is not always matched with the self-oscillation frequency in the self-oscillation circuit 30. In this case, it is preferred that the additional capacity C' and additional resistor R' are connected to the piezoelectric oscillator 1 as shown in FIG. 11. In this case, the additional capacity C' functions in a manner that it corrects a passing frequency of the high-pass filter, while the additional resistor R' functions in a manner that it corrects a passing frequency of the low-pass filter. Thereby, the self-oscillation frequency of the self-oscillation circuit 30 can be matched with or approximated to the anti-resonance frequency of the piezoelectric oscillator 1. In this embodiment too, it is preferred that the additional capacity C' and additional resistor R' and/or the electrostatic capacity Cs and resistor R2 be comprised of a freely variable element.

It shall be appreciated that the additional capacity C' and additional resistor R' may be connected in parallel to the piezoelectric oscillator 1 in FIG. 11 and that the additional capacity C' and additional resistor R' may be connected in series to the piezoelectric oscillator 1 in FIG. 9. Moreover, configuration may be such that either one of the additional capacity C' or additional resistor R' is provided in FIG. 9 and FIG. 11. Namely, that either one of the high-pass filter or low-pass filter is adjusted is already effective in that the resonance frequency or anti-resonance frequency of the piezoelectric oscillator can be approximated to the self-oscillation frequency.

In the embodiments represented by FIG. 9 and FIG. 11, there is each constructed a self-oscillation circuit utilizing the piezoelectric oscillator as an application of the capacitive-component reducing circuit including the damping capacity Cd (or Cd') and electrostatic capacity Cs.

A physical electronic member realizing the electrostatic capacity Cs may be made of the same material constituting the piezoelectric oscillator 1. Part of the material constituting the piezoelectric oscillator may not be polarization-performed and such a portion may be used as the electrostatic capacity Cs. Here, it suffices that the amplifiers 27, 37 is a means for amplifying the voltage and the amplifying means may be constituted by a transistor, op-amp, transformer and so on.

Figure 13:
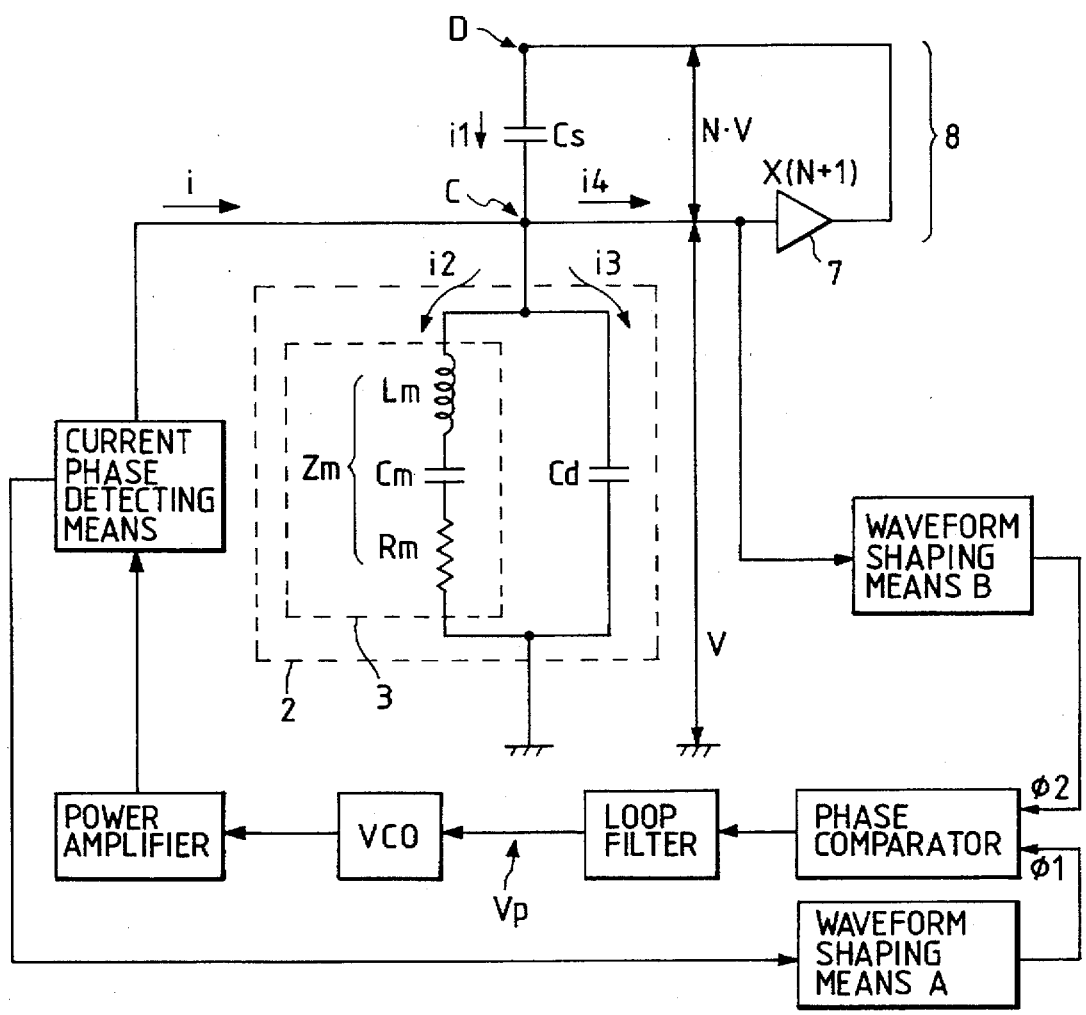
FIG. 13 is an equivalent circuit diagram showing a drive apparatus for a resonance tracking-type piezoelectric oscillator according to an embodiment of the present invention.

FIG. 13 illustrates a drive apparatus in which the resonance point of the piezoelectric oscillator is tracked, according to still another embodiment of the present invention.

Referring to FIG. 13, a first electrode of the piezoelectric oscillator 2 is connected to ground while a drive voltage V is applied to a second electrode thereof (another side). At a point C where the drive voltage is supplied in the a second electrode, the amplifier 7 having a gain of a factor N+1 is connected. The electrostatic capacity Cs connected in series to an amplifying output end of this amplifier 7 is connected to the point C, thus constructing the loop circuit 8 (capacitive-component reducing circuit). This structural aspect is the same as in the circuit shown in FIG. 1.

Referring still to FIG. 13, a supply current to the piezoelectric oscillator 2 is defined as i, the current flowing through the electrostatic capacity Cs as i1, the impedance of a series resonance side 3 in the piezoelectric oscillator 2 as Zm, the current flowing therethrough as i2, the current flowing through the damping capacity Cd as i3 and the current flowing through the amplifier 7 as i4.

When the voltage V is applied to the point C, the voltage at a point D will be (N+1)V due to the amplifier 7. Hence, the voltage equal to N·V is applied between points D and C (D–C). Because the impedance at D–C is $1/(j\omega Cs)$, the i1 can be expressed by equation 31.

(Equation 31)

$$i1 = j\omega Cs \cdot N \cdot V$$

Similarly, i2 and i3 can be expressed by equation 32 and equation 33.

(Equation 32)

$$i2 = V/Zm$$

(Equation 33)

$$i3 = j\omega Cd \cdot V$$

If i4 is neglected because i4 is a very small current, i can be expressed by equation 34.

(Equation 34)

$$i = i2 + i3 - i1$$

Substituting equations 31, 32 and 33 into equation 34 results in equation 35.

(Equation 35)

$$i = V/Zm + j\omega(Cd - N \cdot Cs) \cdot V$$

Here, if equation 36 holds,
(Equation 36)

$$Cs = Cd/N$$

i will equal the right-hand side term of equation 32, and i will equal i2. Namely, the supply current supplied to the piezoelectric oscillator 2 will solely account for a quantity flowing into the impedance Zm of the series resonance side 3 and no current is supplied to the damping capacity Cd which does not contribute to the oscillation.

Figure 14A:
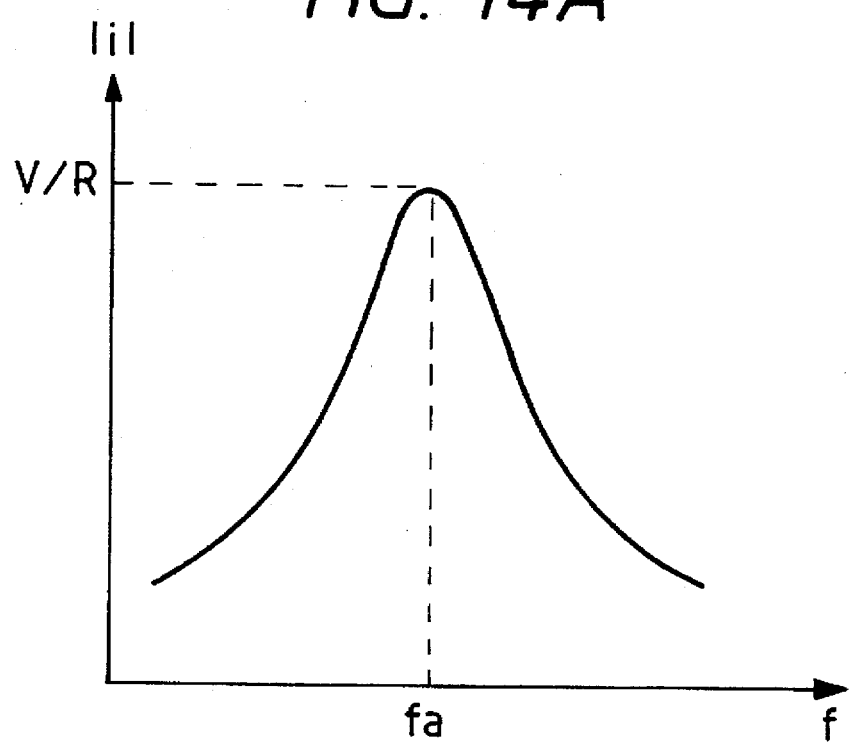
FIG. 14A and FIG. 14B are graphs showing a gain of a supply current to the piezoelectric oscillator shown in FIG. 13 and its phase characteristics.
Figure 14B:
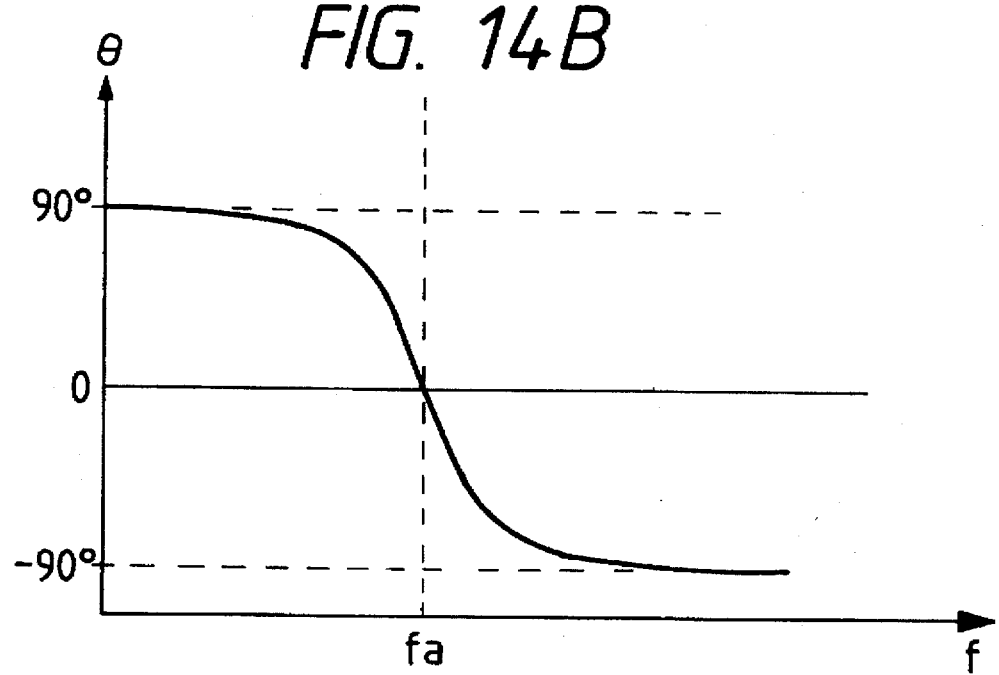

Then, the gain characteristic for the supply current i is expressed by equation 37, the resonance point by equation 38 and the phase characteristic by equation 39. FIG. 14A shows a frequency characteristic for the gain of the supply current i, while FIG. 14B shows a frequency characteristic for the phase of the supply current i.

$$i = V/Zm = V/\{Rm + j(\omega Lm - 1/\omega Cm)\} \quad \text{(Equation 37)}$$
$$= V \cdot e^{j\theta}/[\sqrt{\{Rm^2 + (\omega Lm - 1/\omega Cm)^2\}}\,]$$

(Equation 38)

$$fa = 1/\{2\pi\sqrt{(Lm \cdot Cm)}\}$$

(Equation 39)

$$\theta = -\tan^{-1}\{(\omega Lm - 1/\omega Cm)/Rm\}$$

With reference to FIG. 14B, the phase difference between the phase of the supply current to the piezoelectric oscillator 2 and the phase of the drive voltage applied to another electrode of the piezoelectric oscillator 2 is 0 degree in the resonance point fa. The embodiment represented by FIG. 13 is achieved by directing attention to this fact. The drive apparatus for the piezoelectric oscillator which tracks the resonance point is thus achieved by detecting this phase difference.

Referring still to FIG. 13, an A.C. power source portion for driving the piezoelectric oscillator 2 includes a current phase detecting means, a waveform shaping means A, a waveform shaping means B, a phase comparator, a loop filter, a voltage control oscillator (VCO) and a power amplifier.

The current phase supplied from the A.C. power supply source portion to another electrode of the piezoelectric oscillator 2 is detected by the current phase detecting means. An output which is waveform-shaped at the waveform shaping means A is denoted as $\phi 1$ while an output for which the voltage phase applied to the piezoelectric oscillator 2 is waveform-shaped by the waveform shaping means B is denoted as 42. Both the waveform-shaped outputs are input to the phase comparator so that the phase error of $\phi 1$ and $\phi 2$ is detected. A phase-error output from the phase comparator is fed to the loop filter (low-pass filter) so that a high-frequency component thereof is removed therefrom and then a phase-error voltage Vp is obtained. This phase-error voltage Vp is input to the VCO, so that a frequency output corresponding to the Vp is obtained. Thereafter, a VCO output is power-amplified at the power amplifier and then is applied to the piezoelectric oscillator 2 via the current phase detecting means.

Here, the phase comparator, loop filter and VCO operate in a manner that the oscillation frequency of the VCO becomes higher when the phase of the output (current phase) $\phi 1$ is further forward than that of the output (voltage phase) $\phi 2$. Inversely, the phase comparator, loop filter and VCO operate in a manner that the oscillation frequency of the VCO becomes lower when the phase of the output (voltage phase) $\phi 2$ is further forward than that of the output (current phase) $\phi 1$. The oscillation frequency is fixed when the phase of the output $\phi 1$ is the same as that of the output $\phi 2$, that is, when the phase difference between the current phase and voltage phase is 0 degree. As illustrated in FIG. 14B, when the phase of the current output $\phi 1$ is the same as that of the voltage output $\phi 2$, the piezoelectric oscillator 2 will be driven at the resonance point. When the resonance frequency point of the piezoelectric oscillator declines due to the influence of the external environment and the like, $\phi 2$ becomes a forward phase compared to $\phi 1$ and the frequency of the VCO is variable-controlled at a low level, thus the resonance can be tracked inversely, when the resonance frequency thereof becomes high, $\phi 1$ becomes a forward phase compared to $\phi 2$ and the frequency of the VCO becomes high, thus the resonance can be tracked.

In the drive apparatus shown in FIG. 13, there is no need to provide a sensor which detects the resonance frequency as found in the conventional example, and the drive frequency of the piezoelectric oscillator can be fixed to the resonance frequency of the piezoelectric oscillator. The structural scheme realized by the present invention depicted in FIG. 13 will be extremely effective especially when the addition of such a sensor is not possible in terms of space availability or overall cost performance. Moreover, the resonance frequency can be automatically tracked even if the resonance point is unduly changed due to the heat generated. Moreover, the circuit realized by the present invention can be applied to all types of piezoelectric oscillators. Thus, it can be adapted to the drive apparatus of a piezoelectric motor, piezoelectric transformer and piezoelectric gyro, so that the resonance frequency can be constantly tracked even if the resonance frequency of the piezoelectric oscillator is changed due to the temperature change or the like.

Namely, in the drive apparatus shown in FIG. 13, provision of the loop circuit 8 (capacitive-component reducing circuit) eliminates the power consumption caused by the damping capacity Cd in the piezoelectric oscillator 2, and realizes the drive operation of tracking the resonance of the piezoelectric oscillator 2.

Here, a physical electronic member realizing the electrostatic capacity Cs may be made of the same material as that constituting the piezoelectric oscillator 2. Part of the material constituting the piezoelectric oscillator 2 is made as a polarization-not-performed portion and therefore such portion can be used as the electrostatic capacity Cs. It suffices that the amplifier is a means for amplifying the voltage and the amplifier 7 may be constituted by a transistor, op-amp, transformer and so on.

Figure 15:
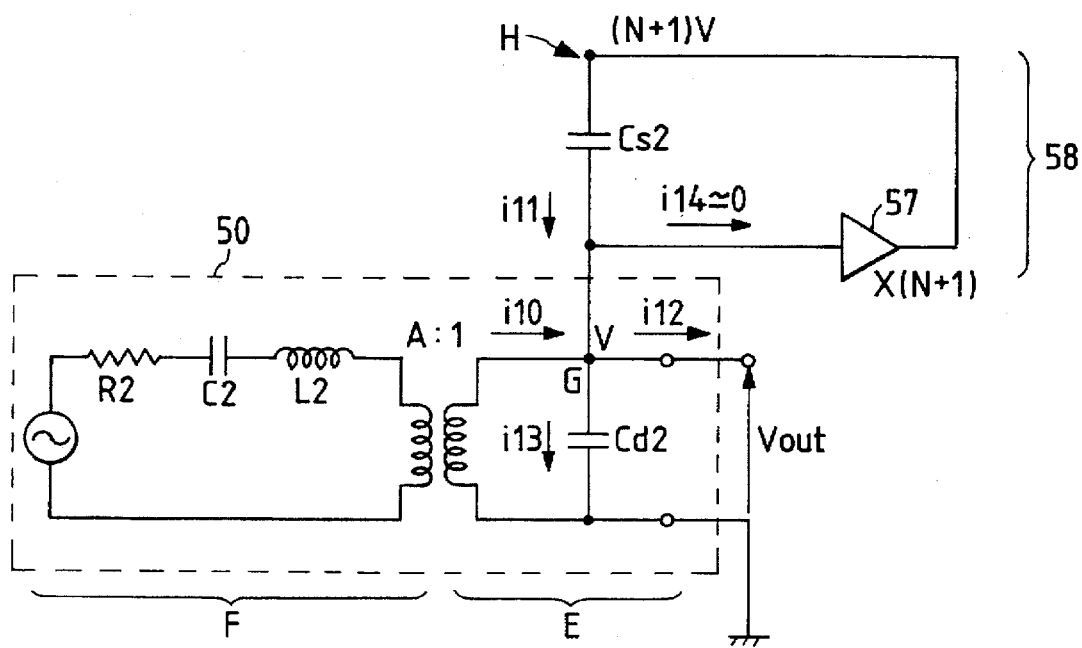
FIG. 15 is an equivalent circuit diagram showing a detection apparatus of the piezoelectric oscillator according to an embodiment of the present invention.

FIG. 15 illustrates a detection apparatus according to still another embodiment of the present invention.

Referring to the equivalent circuit shown in FIG. 15, a piezoelectric oscillator 50 is expressed by means of an electric circuit scheme in a manner that voltage is generated when the piezoelectric oscillator receives an external stress. FIG. 15 is the equivalent circuit for the detection apparatus in which, for example, oscillation given to the piezoelectric oscillator by Corioli's force is detected in an oscillation-type gyroscope. A portion indicated by F in the equivalent circuit of FIG. 13 indicates generation of mechanical stress, and this is converted to an electric signal by an equivalent transformer. Cd2 in a portion indicated by E in the same equivalent circuit indicates the damping capacity which is a capacitive component as a dielectric substance of piezoelectric material.

An electrode of the piezoelectric oscillator 50 is connected to ground while, at a second electrode thereof (another side thereof) an amplifier 57 having a gain in a factor of (N+1) and the electrostatic capacity Cs2 are connected in series. Thus, there is constructed a similar loop circuit 58 (capacitive-component reducing circuit) to that shown in FIG. 1. Namely, in this detection apparatus, the amplifier 57 constituting the capacitive-component reducing circuit amplifies voltage generated at a point G.

Still in reference to FIG. 15, the current generated by the external stress is defined as i10, the current flowing through the electrostatic capacity Cs2 as i11, the current flowing through the damping capacity Cd2 as i13 and the current extracted as an output as i12. Because an input current into the amplifier 57 is extremely small, this will be ignored.

If voltage generated in one side of the electrode of the piezoelectric oscillator 50 is defined as V, the voltage at a point H is (N+1)·V, and an amount of N·V voltage is applied between points H and G (H–G). The impedance between H–G points is $1/(j\omega Cs2)$, therefore i11 will be expressed by equation 40.

(Equation 40)

$$i11 = j\omega Cs2 \cdot N \cdot V$$

Voltage V is applied to the damping capacity Cd2, therefore i13 will be expressed by equation 41.

(Equation 41)

$$i13 = j\omega Cd2 \cdot V$$

When the relationship of equation 42 is established, equation 43 holds.

(Equation 42)

$$Cs2 = Cd2/N$$

(Equation 43)

$$i13 = i11$$

Here, the relationship of equation 44 holds at the point G, and substituting equation 43 into equation 44 results in equation 45.

(Equation 44)

$$i11 + i10 = i13 + i12$$

(Equation 45)

$$i12 = i10$$

Figure 16:
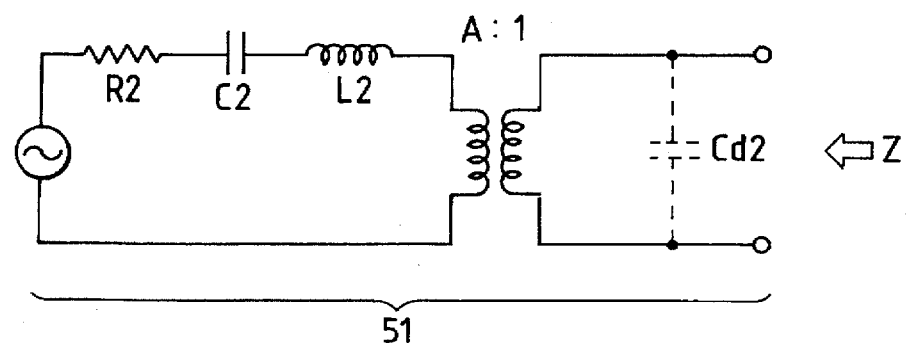
FIG. 16 is an equivalent circuit diagram showing a state in which a damping capacity component of the piezoelectric oscillator shown in FIG. 15 is equivalently canceled out.

Accordingly, if the electrostatic capacity Cs2 is 1/N times the damping capacity Cd2, the current from the loop circuit 58 is supplied to the damping capacity Cd2. As a result thereof, the generated current i10 due to the charge generated by the external stress is not supplied to the damping capacity Cd2, so that it can be all extracted externally. This state is expressed by an equivalent circuit 51 of FIG. 16. Compared to the case in which there exists the damping capacity Cd2, it is clarified that the output impedance Z is increased and the output sensitivity as a sensor is improved.

In this detection apparatus, a condition for which the current i13 flowing through the damping capacity Cd2 is canceled out is to satisfy equation 42, and this condition is given by a function of the electrostatic capacity Cs2 and a gain N of the amplifier 57, and does not involve a function of the frequency of the detection voltage. Therefore, the frequency dependency is not included in the condition for canceling out the damping capacity Cd2. As for adjustment of the electrostatic capacity Cs2 in the course of canceling out the damping capacity Cd2, it will be far easier than the adjustment of an inductance L and compactness can be achieved by utilizing a varicap- or trimmer-type variable electrostatic capacity. Or, a similar advantageous effect can be obtained if the gain N of the amplifier 57 is adjusted by variable resistance while the electrostatic capacity Cs2 is fixed, thus further compactness can be achieved.

There of course can be achieved an advantageous effect in which the influence of the damping capacity Cd2 can be reduced even if the electrostatic capacity Cs2 to be connected is not perfectly matched with the condition set forth in equation 42. Moreover, a physical electronic member realizing the electrostatic capacity Cs2 may be made of the same material as that constituting the piezoelectric oscillator. Or, in an oscillation-type gyroscope and the like, only part of the piezoelectric material, provided in a detection portion, constituting the piezoelectric oscillator may not be polarization-performed and such a portion may be used as the electrostatic capacity Cs2. Or, when the entire piezoelectric material of the piezoelectric oscillator is polarization-performed, a portion to which the oscillation is not given in this piezoelectric material may be used as the electrostatic capacity Cs2. Moreover, it suffices that the amplifier 57 is a means for amplifying the voltage, and such means may be constituted by a transistor, op-amp, transformer and so on.

Figure 18:
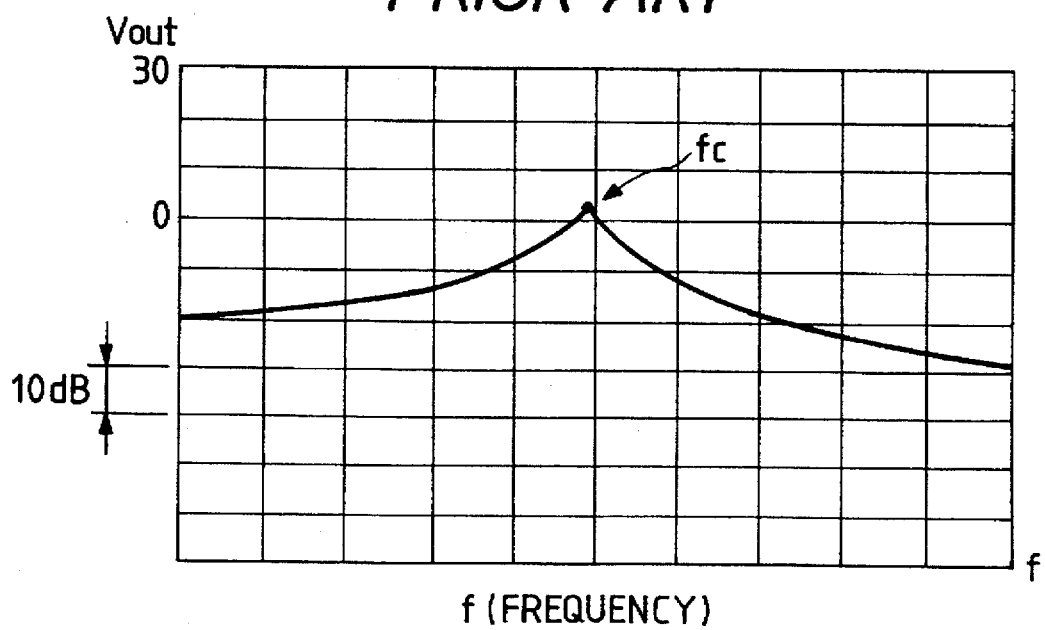
FIG. 18 is a graph showing an experimental result in the conventional piezoelectric oscillator's detection apparatus.
Figure 20:
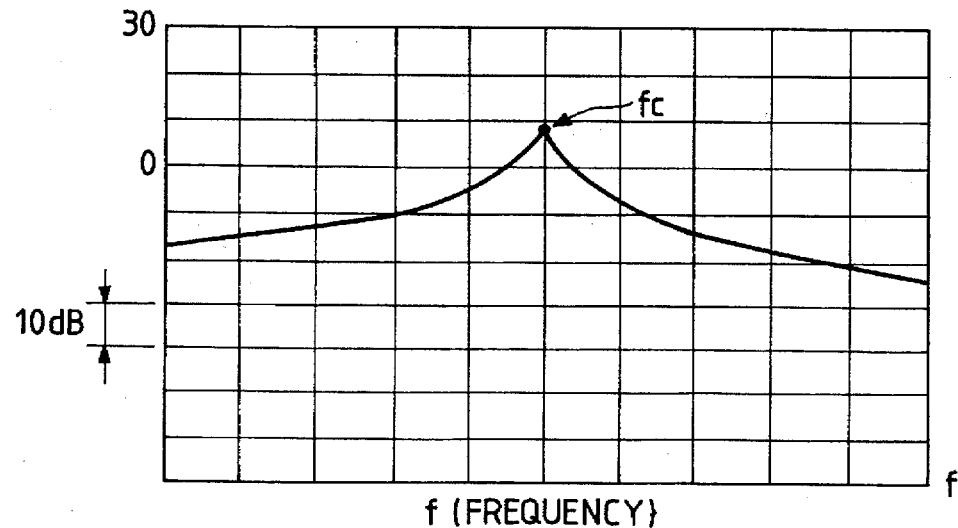
FIG. 20 is a graph showing an experimental result in the piezoelectric oscillator's detection apparatus according to the present invention.

FIG. 18 and FIG. 20 illustrate experimental results regarding the detection apparatus of the present invention shown in FIG. 15.

The deposition members 10 are used in the experiment, as shown in FIG. 8.

Figure 17:
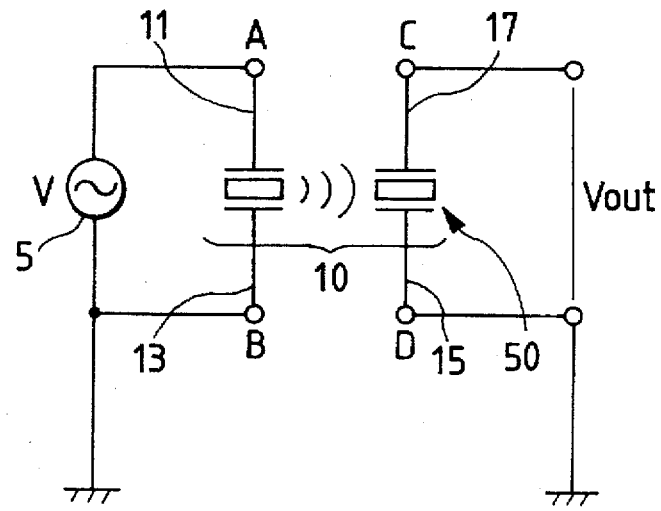
FIG. 17 is an equivalent circuit diagram showing the conventional piezoelectric oscillator's detection apparatus used for an experimental purpose.

FIG. 18 shows the experimental result in a conventional detection apparatus which does not employ the loop circuit 58 (capacitive-component reducing circuit) of the present invention. In the experimental apparatus, the drive electrode 11, electrode 13, detection electrode 17, and electrode 15 of the deposition members 10 shown in FIG. 8 are each connected to terminal A, terminal B, terminal C and terminal D of the experimental circuit shown in FIG. 17. The terminal B and terminal D shown in FIG. 17 are connected to ground. The drive voltage is supplied to the piezoelectric material 12 from the A.C. drive power source 5 via the drive electrode 11 and electrode 13 of FIG. 8 so that the piezoelectric material performs curvature-oscillation. Then, the oscillation transmitted to the piezoelectric material 16 via the glass substrate 14 is detected. The piezoelectric oscillator 50 shown in the equivalent circuit of FIG. 15 corresponds to this piezoelectric material 16 of FIG. 8.

FIG. 18 indicates the output voltage Vout between the terminal C and terminal D (C–D) shown in FIG. 17. FIG. 18 is a graph whose axis of abscissa indicates a frequency and whose axis of ordinate indicates the output voltage Vout (dB), and fc indicates the maximum sensitivity frequency in the course of detection.

Figure 19:
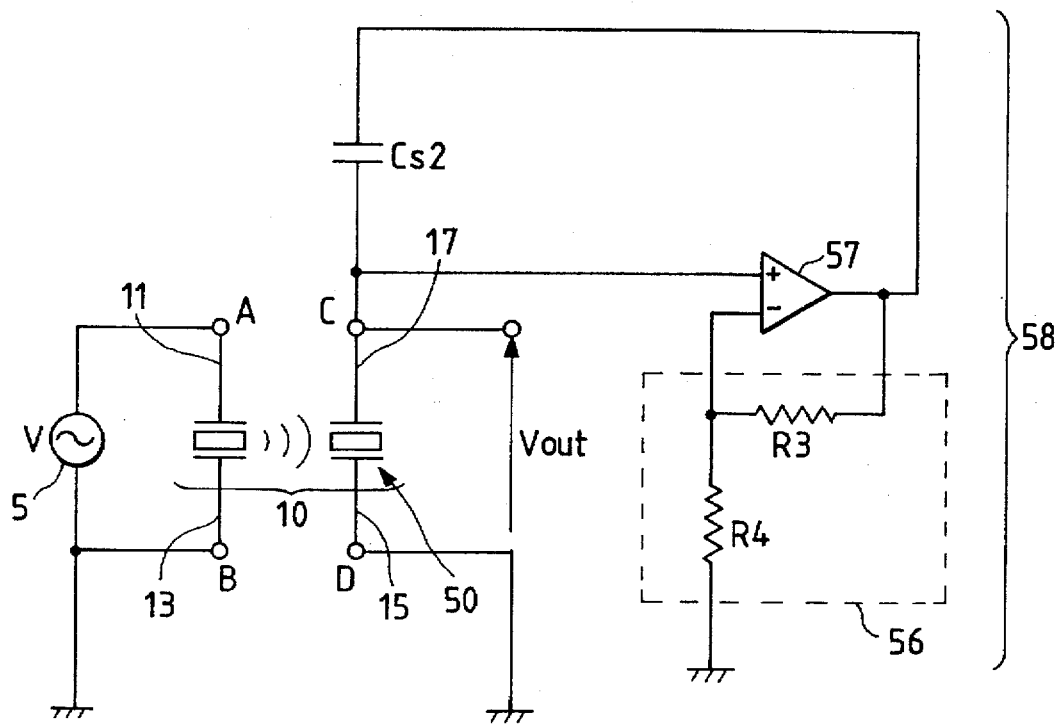
FIG. 19 is an equivalent circuit diagram showing an piezoelectric oscillator's detection apparatus according to the present invention for an experimental purpose.

FIG. 20 shows the experimental result in which the loop circuit 58 (capacitive-component reducing circuit) of the present invention is utilized. In this experimental apparatus, terminal B and terminal D are connected to ground while terminal A is connected to the A.C. drive power source 5 as shown in FIG. 19. The loop circuit 58 (capacitive-component reducing circuit) in which the amplifier 57 having a gain of factor (N+1) is connected in series to the electrostatic capacity Cs2 is connected to terminal C. The negative feedback path 56 including the resistors R3 and R4 sets up the amplification factor of the amplifier 57. Electrodes 11, 13, 17 and 15 of the deposition members shown in FIG. 8 are each connected to the terminals A, B, C and D. In FIG. 19 also, the piezoelectric material 16 corresponds to the piezoelectric oscillator 50.

The drive voltage is supplied to the piezoelectric material 12 from the A.C. drive power source 5 via the drive electrode 11 and electrode 13 of FIG. 8 so that the piezoelectric material performs curvature-oscillation. Then, the oscillation transmitted to the piezoelectric material 16 via the glass substrate 14 is detected. FIG. 20 indicates the output voltage Vout between terminal C and terminal D (C–D) of the experimental apparatus shown in FIG. 19. FIG. 20 is a graph whose axis of abscissa indicates a frequency and whose axis of ordinate indicates the output voltage Vout (dB). In FIG. 19, the amplifier 57 is an op-amp, and each parameter (R3, R4, Cs2) is set according to equation 46 and equation 47.

(Equation 46)

$$N+1=1+R3/R4$$

(Equation 47)

$$Cs2=Cd2/N$$

Comparing output voltages Vout at the fc point in FIG. 18 and FIG. 20 clarifies that in the apparatus of FIG. 20 having the loop circuit 58 (capacitive-component reducing circuit) satisfying the condition set forth in equation 47 presents a higher output voltage by approximately 5 dB than the conventional apparatus of FIG. 18, so that highly sensitive detection is achieved minimizing the influence of the damping capacity Cd2.

Next, modified examples over the above-mentioned embodiments will be described hereinbelow.

First, in the embodiment shown in FIG. 1, there is constructed the loop circuit 8 in which the amplifier 7 having an amplification factor of (N+1) is connected in series to the electrostatic capacity Cs, and which represents a capacitive-component circuit. However, this capacitive-component reducing circuit can also be constructed as shown in FIG. 21.

Figure 21:
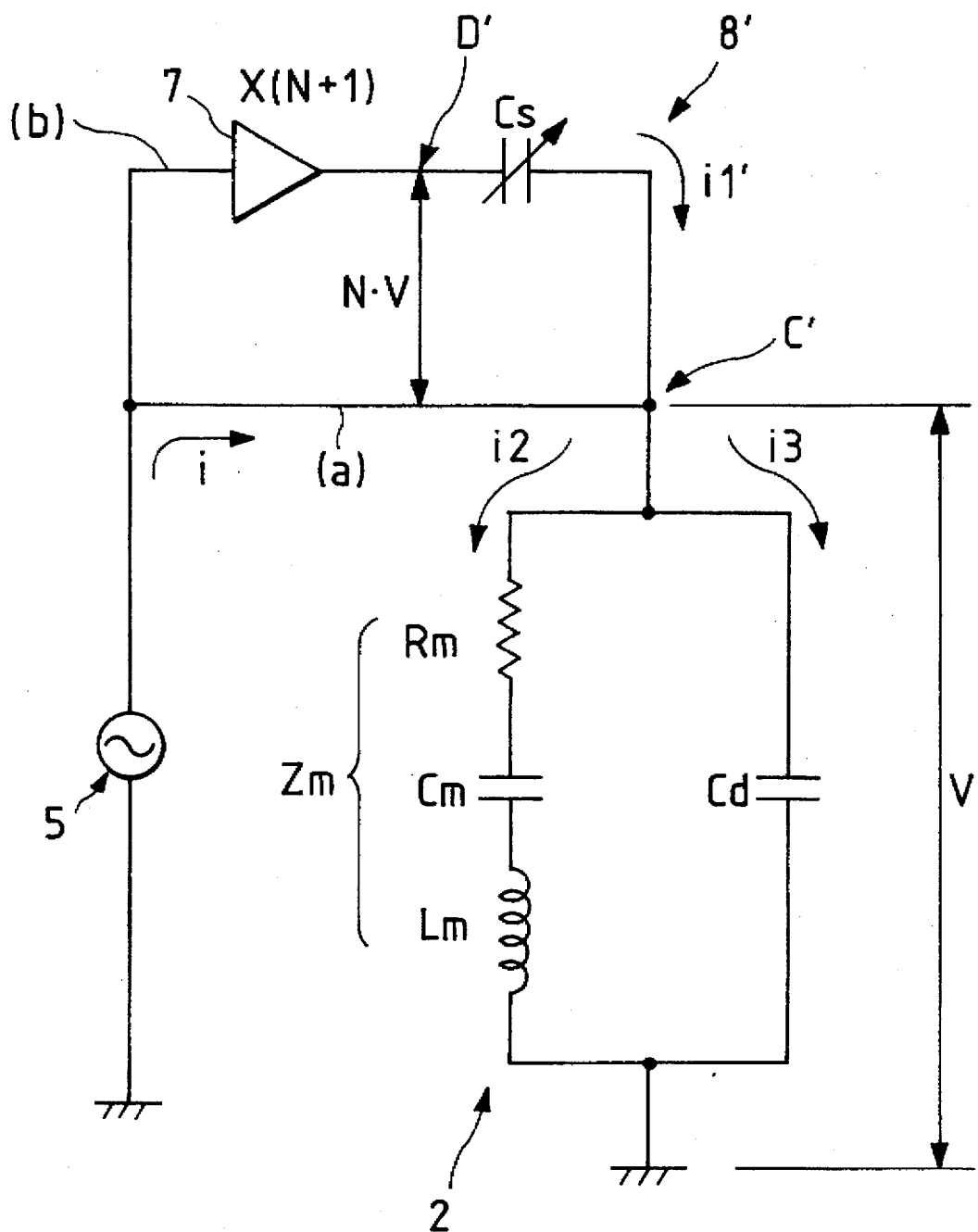
FIG. 21 is an equivalent circuit diagram showing a drive apparatus for the piezoelectric oscillator according to another structural scheme of the present invention.

Referring to FIG. 21, there is provided a path through which the drive power is supplied from the A.C. drive power source 5 to an electrode (point C') at one side of the piezoelectric oscillator 2, and there is provided another path branched out therefrom in which the amplifier 7 and electrostatic capacity Cs are connected in series while the electrostatic capacity Cs is connected to the point C'. Namely, the path (a) supplying the drive power between a supply side of the drive power (A.C. drive power source 5) and the piezoelectric oscillator 2 is connected in parallel to another path (b) having the amplifier 7 and electrostatic capacity Cs. In this embodiment also, the drive voltage V supplied to said side of the piezoelectric 2 is amplified by the amplifier by a factor of (N+1), and the amplifying output end of the amplifier 7 is connected to the point C' via the electrostatic capacity Cs.

FIG. 21 shows a same type of piezoelectric oscillator as that shown in FIG. 1. When the current supplied from the A.C. drive power source 5 to the point C' is denoted as i, the currents flowing through the series resonance side and damping capacity Cd denoted as i2 and i3, respectively, and the current flowing through the electrostatic capacity Cs denoted as i1', the relationship between each current will be such that i1 in equation 9 is replaced by i1'.

Therefore, in the drive apparatus equipped with the capacitive-Component reducing circuit 8' also shown in FIG. 21, when the condition expressed by equation 11, that is, the condition for which the electrostatic capacity Cs is 1/N times the damping capacity Cd is met, the supply current i from the drive power is not consumed by the damping capacity Cd, thus the piezoelectric oscillator can be efficiently driven.

Moreover, in the embodiment shown in FIG. 13 also, even if the loop circuit 8 is replaced with the capacitive-component reducing circuit 8' shown in FIG. 21, the same advantageous effects can be obtained.

Figure 22:
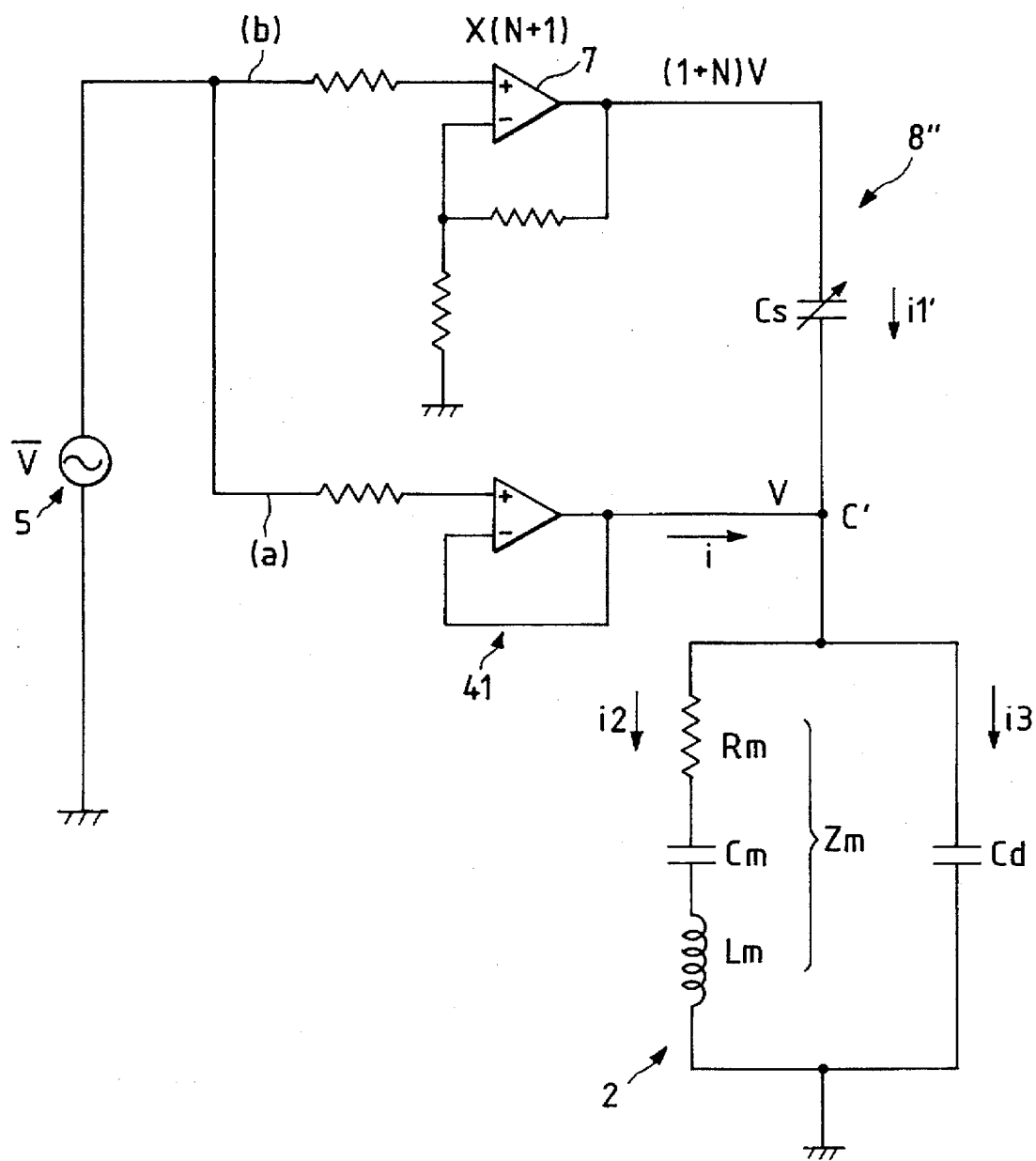
FIG. 22 is an equivalent circuit diagram showing an further preferred example improved over the drive apparatus of the piezoelectric oscillator shown in FIG. 21.

FIG. 22 illustrates a further preferred example improved over the drive apparatus for the piezoelectric oscillator shown in FIG. 21. Referring to FIG. 22, a path (a) through which the drive power is supplied to the electrode (point C') a first side of the piezoelectric oscillator 2 is connected in parallel to a path (b) having the amplifier 7 and electrostatic capacity Cs connected in series to each other, between the A.C. drive power source 5 serving as a drive power supplying side and the electrodes (point C') the first side. Namely, in a branched-out manner there are formed the path (a) supplying the power from a supply portion of the drive power to the piezoelectric oscillator 2 and the path (b) constructed from the supply portion of the drive power to the piezoelectric oscillator 2 via the amplifier 7 and electrostatic capacity Cs so as to constitute a capacitive-component reducing circuit 8". There is provided a voltage follower (buffer amplifier) 41 serving as a voltage holding means within the path (a) supplying the power to the piezoelectric oscillator 2.

The voltage follower 41 is an electric part conventionally known to the persons skilled in the art in which an output side and inverting input side of the op-amp is short-circuited and a 100% feedback is applied so that a voltage gain is set to 1. The voltage follower 41 plays a role to hold the voltage of the drive power, and prevents the oscillation from being generated. Namely, in the circuit configuration shown in FIG. 1, setting amplification gain at too high a level may amplify the voltage at point C, and the oscillation may occur in the loop circuit 8 because the loop circuit 8 is of a feedback type where the electricity is fedback to the point C via the electrostatic capacity Cs, thus creating an unstable state. However provision of the voltage follower 41 as shown in FIG. 22 can prevent the formation of an oscillation loop in the path (a) and path (b), so that a very stable drive apparatus for the piezoelectric oscillator can be constructed.

Figure 23:
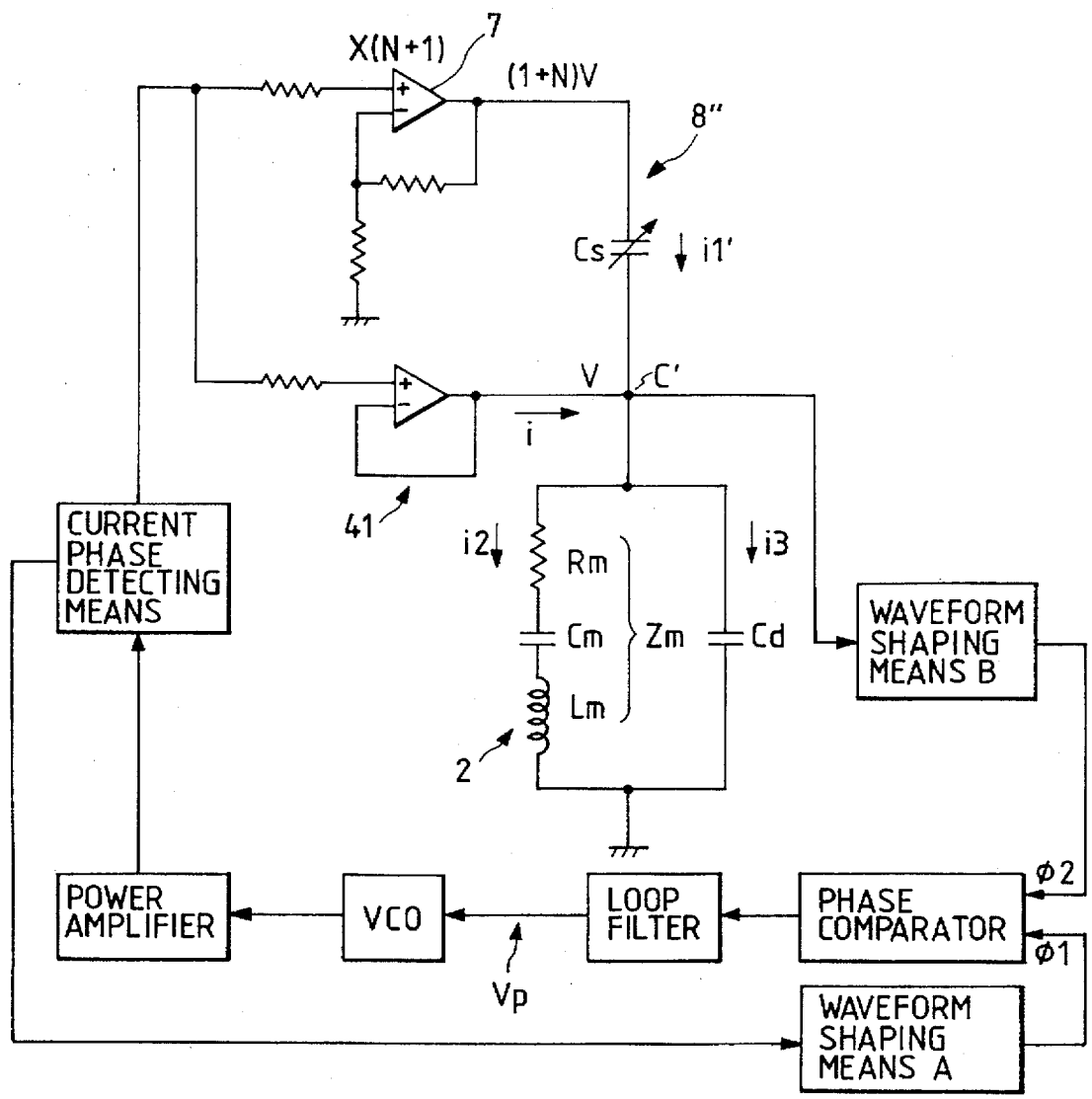
FIG. 23 is an equivalent circuit diagram showing an example in which configuration shown in FIG. 22 is applied to the resonance tracking-type drive apparatus shown in FIG. 13.

FIG. 23 shows an example in which configuration including the capacitive-component reducing circuit 8" shown in FIG. 22 is applied to the resonance tracking-type drive apparatus shown in FIG. 13. Similar to the description thus far based on FIG. 13 and FIG. 14, the phase of the current supplied from the power amplifier serving as a supply portion (supply side) of the drive power is detected by the current phase detecting means, and the output therefrom (the current phase) φ1 is sent to the phase comparator. The voltage at point C', that is, the voltage phase, as the output φ2, supplied to the piezoelectric oscillator 2 is sent to the phase comparator. Then, the voltage control oscillator (VCO) is controlled in a manner such that the oscillation frequency is fixed if the phase difference between outputs φ1 and φ2 is 0. Therefore, the drive operation which tracks the resonance point against the piezoelectric oscillator 2 becomes possible.

In FIG. 1, there is shown the piezoelectric oscillator as an electrostatic-type transducer means. The same advantageous effects can be achieved in the drive apparatus for an electrostatic transducer 60 as shown in FIG. 24A.

Figure 24A:
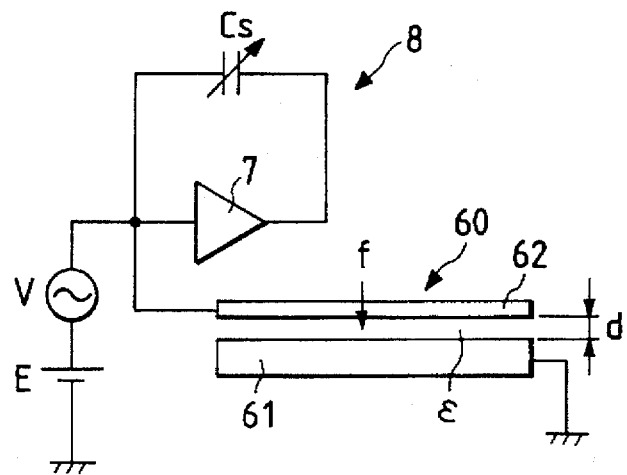
FIG. 24A and FIG. 24B are structural diagrams for the drive apparatus of the electrostatic transducer and an equivalent circuit diagram thereof, respectively.

Referring to FIG. 24A, in the electrostatic transducer 60, a planar electrode 61 at a fixed side is disposed counter to a planar electrode 62 at a movable side with a small space d therebetween. When a facing area of electrodes 61 and 62 is denoted as A, a bias voltage given between the electrodes as E, an input voltage (drive voltage) given between the electrodes as V and a dielectric constant of the air layer between the electrodes as e, an electrostatic driving force f acting between the electrodes 61 and 62 due to the input voltage V is expressed by equation 48.

(Equation 48)

$$f=\{(6\delta\cdot A\cdot E)/d^2\}\cdot V$$

Figure 24B:
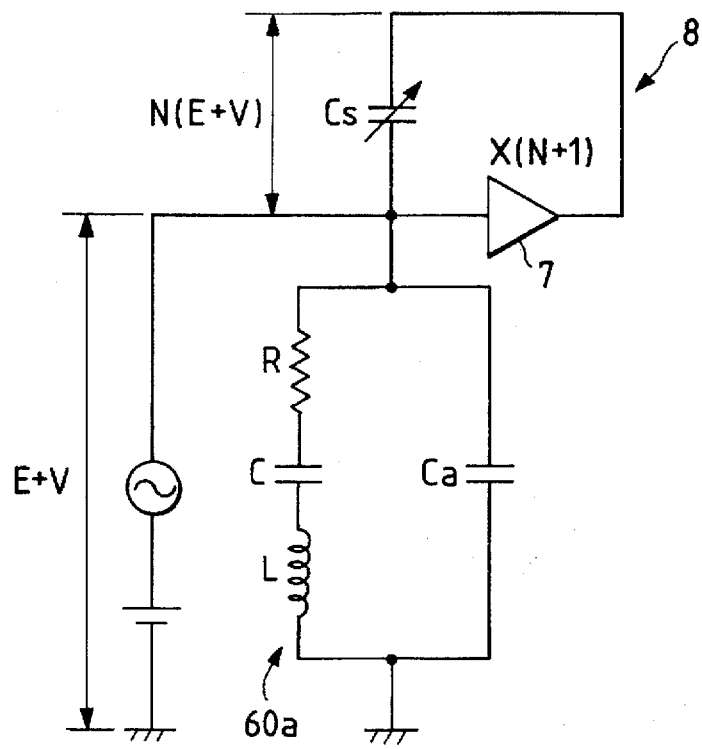

An equivalent circuit for which the electrostatic transducer 60 is being driven in the vicinity of the resonance point is shown as 60a in FIG. 24B (see a portion marked with reference numeral 60a). This is equivalent to the state where the piezoelectric oscillator is being oscillated in the vicinity of the resonance point as shown in FIG. 1. With reference to FIG. 24B, Ca denotes the capacitive component between the electrodes 61 and 62. R indicates a mechanical drive resistance of the movable electrode 62, L a spring constant of the movable electrode 62 due to the mechanical support, and C a viscous resistance due to the mechanical elastic support. In the course of driving the electrostatic transducer 60, the drive current is also consumed by the capacitive component Ca, and this current consumption does not contribute to the driving operation for the movable electrode 62.

Therefore, the same loop circuit 8 as that in FIG. 1 (or the capacitive-component reducing circuit 8' of FIG. 21, or further preferably the capacitive-component reducing circuit 8" of FIG. 22) is added as shown in FIG. 24A and FIG. 24B such that the electrostatic capacity Cs is 1/N times the capacitive component Ca and the amplification degree for the amplifier 7 is set to the factor of (N+1). Thus, in a similar manner to the drive apparatus for the piezoelectric oscillator, the current consumed at the capacitive-component Ca can be minimized and moreover canceled out, so that the efficient drive operation can be achieved. In this case also, a stable driving operation without generating the oscillation can be performed by employing the capacitive-component reducing circuit 8" including the voltage follower 41 shown in FIG. 22.

This circuitry scheme and advantageous aspects thereby are the same as that of the drive apparatus shown in FIG. 13, and the resonance tracking-type drive apparatus of FIG. 13 and the resonance tracking-type drive apparatus of FIG. 23 can be adapted to the electrostatic transducer 60.

Figure 25A:
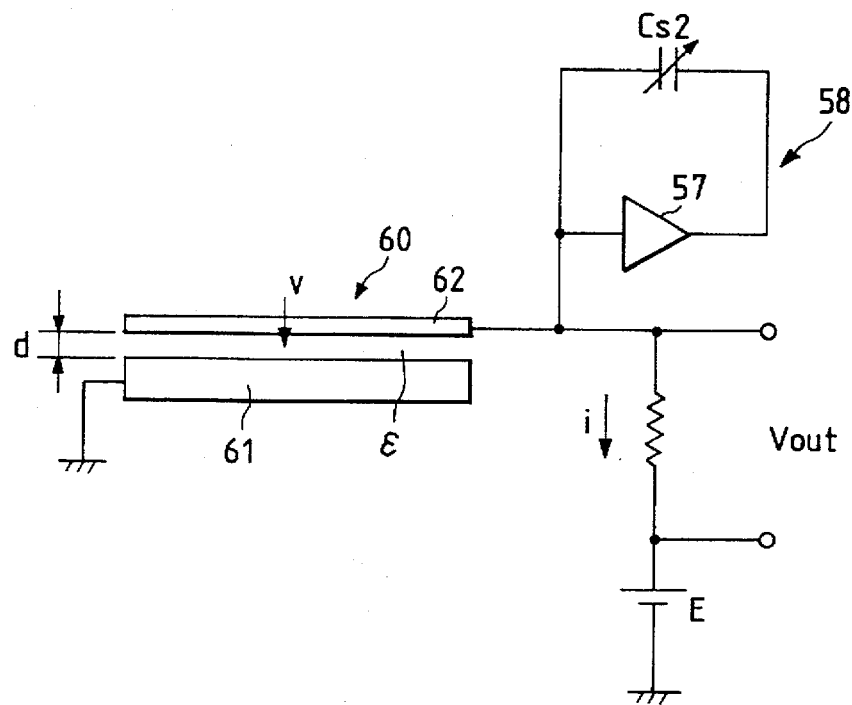
FIG. 25A and FIG. 25B are structural diagrams for the detection apparatus utilizing an electrostatic transducer and an equivalent circuit diagram thereof, respectively.

Next, FIG. 25A shows a detection apparatus for detecting the oscillation utilizing the electrostatic transducer 60. This detection apparatus functions, for example, in the oscillation-type gyroscope, in a manner that the movable electrode 62 is oscillated by the piezoelectric oscillator and the like and the force generated by Corioli's force is supplied to this movable electrode 62.

When a moving velocity of the movable electrode 62 due to the force generated by the Corioli's force or the like is denoted as V, the detection current i will be expressed by equation 49.

(Equation 49)

$$i=\{(\epsilon\cdot A\cdot E)/d^2\}\cdot V$$

By extracting this current i, the output voltage Vout can be obtained.

Figure 25B:
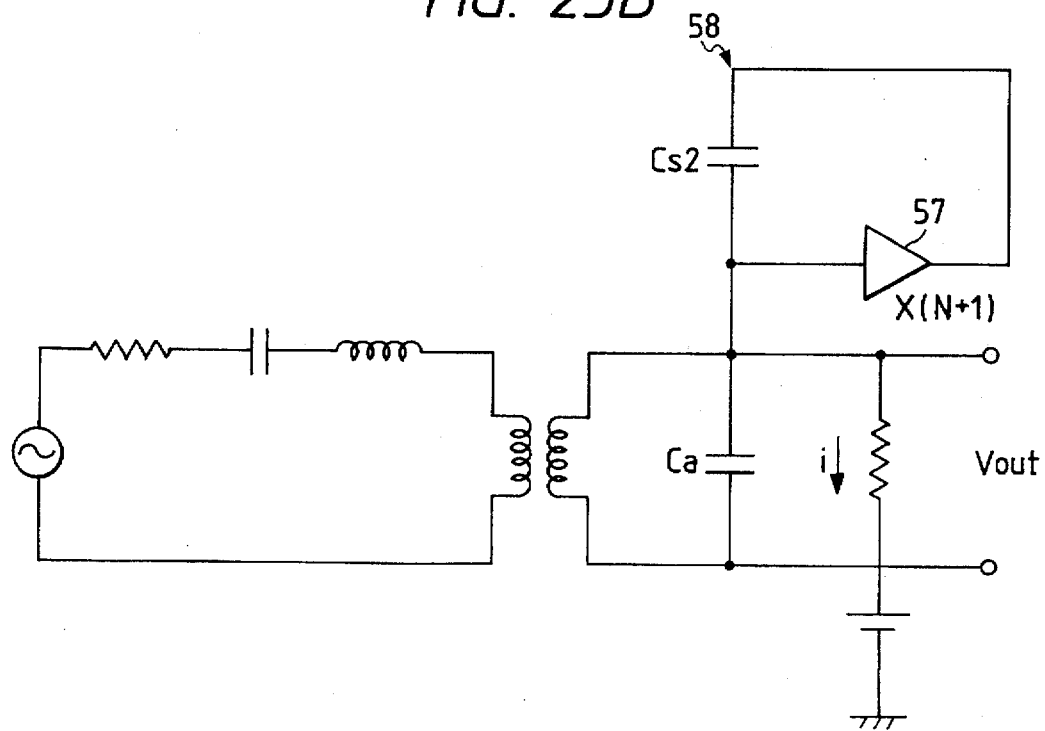
Figure 26A:
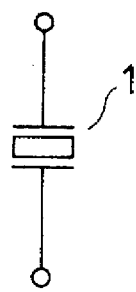
FIG. 26A and FIG. 26B are circuit diagrams for the piezoelectric oscillator and an equivalent circuit diagram thereof in a resonance point, respectively.
Figure 26B:
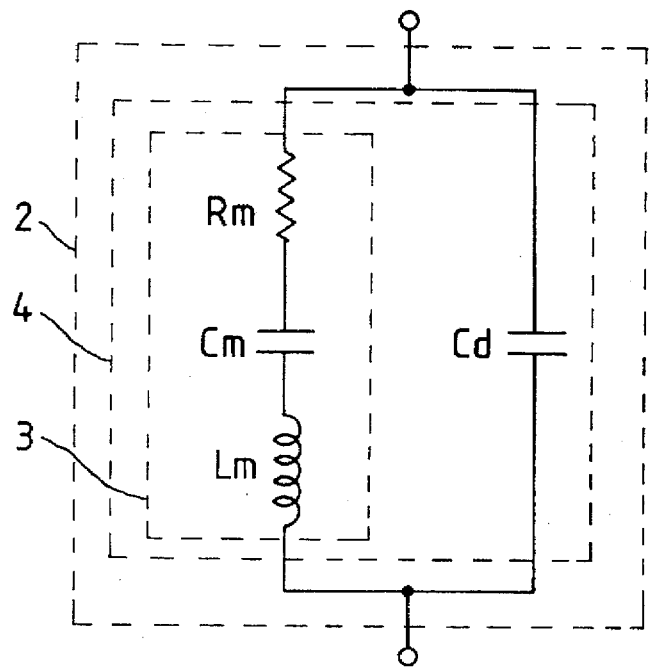
Figure 27:
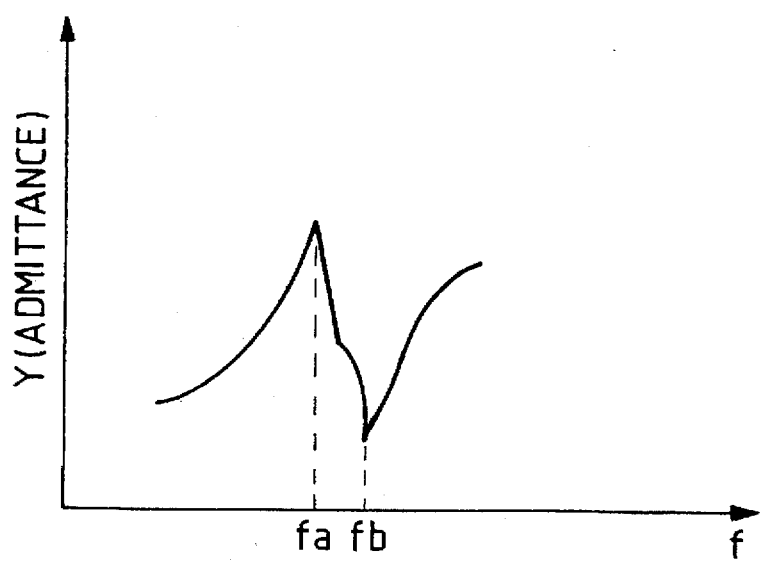
FIG. 27 is a graph showing frequency characteristics for admittance of the piezoelectric oscillator.
Figure 28:
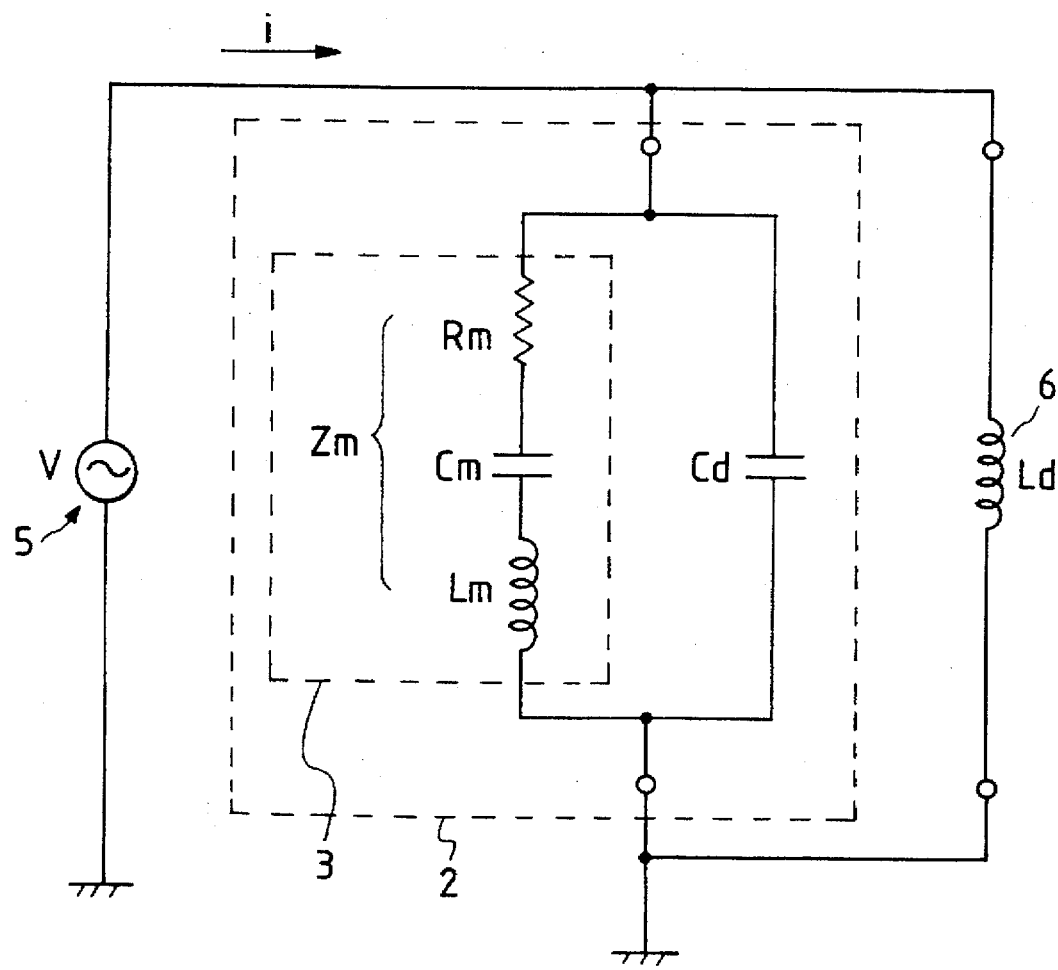
FIG. 28 is an equivalent circuit diagram showing the conventional piezoelectric oscillator's drive circuit in which the damping capacitance component of the piezoelectric oscillator is equivalently canceled out.

In this detection apparatus too, the detection output is decreased by as much as the current flowing through the capacitive component Ca of the electrostatic transducer 60, as illustrated in the equivalent circuit of FIG. 25B. However, similar to the detection apparatus shown in FIG. 15, the loop circuit 58 (capacitive-component reducing circuit) is added in which the amplifier 57 has the amplification factor of (N+1) and a capacity value of the electrostatic capacity Cs2 is set to 1/N of the capacitive component Ca. Therefore, similar to the embodiment shown in FIG. 15, the current flowing through the capacitive component Ca is burdened by the current from the loop circuit 58, so that the current obtained by the mechanical-electric conversion can be detected in a higher sensitive manner.

Moreover, in the self-oscillation circuit shown in FIG. 9 as well as FIG. 11, the circuit can be constructed by the electrostatic transducer 60 in place of the piezoelectric oscillator. Namely, when the electrostatic transducer 60 is self-oscillation-driven in the vicinity of the resonance point, the same self-oscillation circuit 20 as that in FIG. 9 will be utilized. Because the electrostatic transducer 60 uses the capacitive component Ca, there appears an anti-resonance point. The equivalent circuit for which the electrostatic transducer 60 is oscillated in the vicinity of the anti-resonance point will be the same type one as in FIG. 12A. Therefore, by employing the self-oscillation circuit 30 shown in FIG. 11, the electrostatic transducer 60 can be self-oscillation-driven in the vicinity of the anti-resonance point.

As described above, by employing the present invention, the capacitive-component reducing circuit comprised of the electrostatic capacity and amplifier is connected to one side (electrode) of the electrostatic-type transducer means such as piezoelectric oscillator and electrostatic transducer. Thus, the current equivalent to the current flowing into the damping capacity component and the like of the piezoelectric oscillator can be supplied to the piezoelectric oscillator, and the damping capacity for the input or output of the piezoelectric oscillator, or the capacity component of the electrostatic transducer can be equivalently canceled out or minimized.

Therefore, when adapted to the drive circuit of the electrostatic-type transducer means, the damping capacity or capacity component can be canceled out without using inductance. Thus, there will be no dependency on the frequency, and the circuit can be easily adjusted and be made compact-sized. Even in the case where the equivalently canceling-out condition is not perfectly met, the capacity component can be equivalently reduced effectively. Moreover, provision of the voltage holding means such as voltage follower in the capacitive-component reducing circuit enables the realization of further stabilized drive operation.

Moreover, when adapted to the detection apparatus such as a piezoelectric gyro, the output impedance will increase. Thus, the output voltage increases so as to improve detectivity. Similar advantageous effects can be obtained when utilizing for the piezoelectric transformer. Thus, the output voltage increases so as to contribute to the improvement of performance as the transformer.

Moreover, when adapted to the filter, canceling out or reducing the damping capacity of the piezoelectric oscillator increases the comparison bandwidth.

Moreover, according to the present invention, the capacitive-component reducing circuit is connected to the electrostatic-type transducer means, and the resonance point is obtained in a manner such that the phase of the current flowing into the piezoelectric oscillator, etc. and the phase of the voltage driving the piezoelectric oscillator, etc. are compared. Then, the apparatus is driven at the thus obtained resonance point, so that the resonance point can be constantly tracked even if the resonance point of the electrostatic-type transducer means fluctuates due to the temperature and so on. Consequently, the tracking operation which has been realized, under the conventional practice, by the sensor provided only at a small portion of the piezoelectric motor can be achieved without use of the sensor at all. Therefore, the present invention's scheme can be suitable not only for all types of piezoelectric motors but also it can be adapted as a frequency tracking-type drive circuit, such as for a piezoelectric sensor and piezoelectric transformer utilizing other piezoelectric effects.

Moreover, the self-oscillation circuit is constructed by the amplifier and frequency selection circuit, and the capacity component and resistance component of the electrostatic-type transducer means which oscillate in the vicinity of the resonance point or anti-resonance point is included in this frequency selection circuit. Thus, the electrostatic-type transducer means can be driven in the vicinity of the resonance point or anti-resonance point so as to perform the efficient drive operation. Moreover, provision of the additional capacity and additional resistance enables the self-oscillation at a frequency which coincides with or is approximated to the resonance point or anti-resonance point of the electrostatic-type transducer means.

Moreover, a resistor by which the amplification factor is set to a high level is included in the negative loop of the amplifier, so that the self-oscillation at a stable amplitude becomes possible.

Besides those already mentioned above, many modifications and variations of the above embodiments may be made without departing from the novel and advantageous features of the present invention. Accordingly, all such modifications and variations are intended to be included within the scope of the appended claims.

What is claimed:

1. A circuit comprising:
    an electrostatic-type transducer including a first terminal connected to ground and a second terminal connected to a drive power source, the electrostatic-type transducer having a damping capacitive component;
    an amplifier having an input terminal coupled to the second terminal of the electrostatic-type transducer, and
    an electrostatic capacitor connected between an amplifying output terminal of the amplifier and the second terminal of the electrostatic-type transducer,
    wherein a gain of the amplifier and a capacitance of the electrostatic capacitor are selected such that the damping capacitive component of the electrostatic-type transducer is minimized.

2. A circuit for reducing a damping capacitive component in an electrostatic-type transducer as claimed in claim 1, wherein the electrostatic-type transducer includes a piezoelectric oscillator and the electrostatic capacitor is constructed by utilizing the same material as that constituting the piezoelectric oscillator.

3. A circuit for reducing a damping capacitive component in an electrostatic-type transducer as claimed in claim 1, wherein the gain of the amplifier is approximately (N+1) times the damping capacitive component of the electrostatic-type transducer and the capacitance of the electrostatic capacitor is approximately 1/N times the damping capacitive component of the electrostatic-type transducer, where N is a positive number.

4. A circuit for reducing a damping capacitive component in an electrostatic-type transducer as claimed in claim 3, wherein the electrostatic-type transducer includes a piezoelectric oscillator and the electrostatic capacitor is constructed by utilizing the same material constituting the piezoelectric oscillator.

5. A drive apparatus for an electrostatic-type transducer driven by a drive power source, the apparatus comprising:
    a path through which a drive power is supplied from the drive power source to a terminal of the electrostatic-type transducer; and
    a circuit for reducing a damping capacitive component of the electrostatic-type transducer, the circuit including an amplifier which amplifies voltage received at the terminal of the electrostatic-type transducer, and an electrostatic capacitor connected between an amplifying output end of the amplifier and the terminal of the electrostatic-type transducer wherein a gain of the amplifier and a capacitance of the electrostatic capacitor are selected such that the damping capacitive component of the electrostatic-type transducer is minimized;
    wherein the amplifier in the circuit for reducing the damping capacitive component is provided in a position where the drive power supplied to the electrostatic-type transducer via said path is amplified.

6. A drive apparatus for an electrostatic-type transducer as claimed in claim 5, wherein the electrostatic-type transducer includes a piezoelectric oscillator and the electrostatic capacitor is constructed by utilizing the same material as that constituting the piezoelectric oscillator.

7. A drive apparatus for an electrostatic-type transducer as claimed in claim 5, wherein the gain of the amplifier is approximately (N+1) times the damping capacitive component of the electrostatic-type transducer and the capacitance of the electrostatic capacitor is approximately 1/N times the damping capacitive component of the electrostatic-type transducer, where N is a positive number.

8. A drive apparatus for an electrostatic-type transducer as claimed in claim 7, wherein the electrostatic-type transducer includes a piezoelectric oscillator and the electrostatic capacitor is constructed by utilizing the same material as that constituting the piezoelectric oscillator.

9. A drive apparatus for an electrostatic-type transducer as claimed in claim 5, further comprising:

a current phase detection means for detecting a current phase flowing through the electrostatic-type transducer;

a phase comparator for comparing the current phase detected by said current phase detection means and a voltage phase of the drive power supplied to the electrostatic-type transducer;

a filter for generating a filtered high frequency component of said phase comparator; and a voltage control oscillator for generating an oscillation frequency based on the filtered high frequency component such that the drive power is supplied based on the oscillation frequency of said voltage control oscillator and the electrostatic-type transducer is driven at a resonance frequency.

10. A drive apparatus for an electrostatic-type transducer as claimed in claim 9, wherein the electrostatic-type transducer includes a piezoelectric oscillator, and the oscillation frequency of said voltage control oscillator is variable-controlled in a manner such that a phase difference compared by said phase comparator between the current phase and voltage phase is zero.

11. A drive apparatus for an electrostatic-type transducer as claimed in claim 5, wherein said path through which the drive power is supplied to the electrostatic-type transducer and a loop including the amplifier and electrostatic capacitor are provided in parallel between the drive power and the electrostatic-type transducer, and wherein a voltage follower is provided in said path through which the drive power is supplied to the electrostatic-type transducer.

12. A drive apparatus for an electrostatic-type transducer as claimed in claim 11, further comprising:

a current phase detection means for detecting a current phase flowing through the electrostatic-type transducer;

a phase comparator for comparing the current phase detected by said current phase detection means and a voltage phase of the drive power supplied to the electrostatic-type transducer;

a filter for generating a filtered high frequency component of said phase comparator; and a voltage control oscillator for generating an oscillation frequency based on the filtered high frequency component such that the drive power is supplied based on the oscillation frequency of said voltage control oscillator and the electrostatic-type transducer is driven at a resonance frequency.

13. A drive apparatus for an electrostatic-type transducer as claimed in claim 12, wherein the electrostatic-type transducer includes a piezoelectric oscillator, and the oscillation frequency of said voltage control oscillator is variable-controlled in a manner such that a phase difference compared by said phase comparator between the current phase and voltage phase is zero.

14. A detection apparatus for an electrostatic-type transducer, the detection apparatus comprising:

an amplifier which amplifies a drive voltage applied to a first terminal of the electrostatic-type transducer;

an electrostatic capacitor connected between an amplifying output terminal of the amplifier and a second terminal of the electrostatic-type transducer; and means for controlling a gain of the amplifier such that the amplifier and the electrostatic capacitor form a capacitive-component reducing circuit for minimizing a damping capacitive component of the electrostatic-type transducer.

15. A detection apparatus for an electrostatic-type transducer as claimed in claim 14, wherein the electrostatic-type transducer includes a piezoelectric oscillator and the electrostatic capacitor is constructed by utilizing the same material as that constituting the piezoelectric oscillator.

16. A detection apparatus for an electrostatic-type transducer as claimed in claim 14, wherein the gain of the amplifier is approximately (N+1) times the damping capacitive component of the electrostatic-type transducer and the capacitance of the electrostatic capacitor is approximately 1/N times the damping capacitive component of the electrostatic-type transducer, where N is a positive number.

17. A detection apparatus for an electrostatic-type transducer as claimed in claim 16, wherein the electrostatic-type transducer includes a piezoelectric oscillator and the electrostatic capacitor is constructed by utilizing the same material as that constituting the piezoelectric oscillator.

18. A drive apparatus for an electrostatic-type transducer, comprising:

a frequency selection circuit including a capacitive component and resistance component of the electrostatic-type transducer; and an operational amplifier connected to said frequency selection circuit, wherein a portion of said frequency selection circuit is connected between an output and a non-inverting input of the operational amplifier to form a positive feedback loop, whereby self-oscillation occurs at a self-oscillation frequency determined by said frequency selection circuit.

19. A drive apparatus for an electrostatic-type transducer as claimed in claim 18, further comprising a negative feedback loop connected between the output and the inverting input of the operational amplifier, the negative feedback loop including an amplitude stabilizing circuit comprising a resistor which determines an amplification factor of said operational amplifier.

20. A drive apparatus for an electrostatic-type transducer as claimed in claim 18, wherein said frequency selection circuit is comprised of a first resistor and first capacitor connected in series within the positive feedback loop, and wherein the capacitive component and the resistance component of the electrostatic-type transducer are connected in parallel between ground and the noninverting input of said operational amplifier.

21. A drive apparatus for an electrostatic-type transducer as claimed in claim 20, further comprising a negative feedback loop connected between the output and the inverting input of the operational amplifier, the negative feedback loop including an amplitude stabilizing circuit comprising a resistor which determines an amplification factor of said operational amplifier.

22. A drive apparatus for an electrostatic-type transducer as claimed in claim 20, wherein a third capacitor and a third resistor are connected in parallel with the resistance component and the capacitive component of the electrostatic-type transducer.

23. A drive apparatus for an electrostatic-type transducer as claimed in claim 22, further comprising a negative feedback loop connected between the output and the inverting input of the operational amplifier, the negative feedback loop including an amplitude stabilizing circuit comprising a resistor which determines an amplification factor of said operational amplifier.

24. A drive apparatus for an electrostatic-type transducer as claimed in claim 18, wherein the resistance component and the capacitive component of said electrostatic-type transducer are connected in series within the positive feedback loop, and a second resistor and second capacitor connected in parallel between ground and the noninverting input of said operational amplifier.

25. A drive apparatus for an electrostatic-type transducer as claimed in claim 24, wherein a third capacitor and a third resistor are connected in series with the resistance component and the capacitive component of said electrostatic-type transducer.

* * * * *